(12) United States Patent
Ito

(10) Patent No.: US 8,483,004 B2
(45) Date of Patent: Jul. 9, 2013

(54) SEMICONDUCTOR DEVICE WITH TRANSISTOR STORING DATA BY CHANGE IN LEVEL OF THRESHOLD VOLTAGE

(75) Inventor: Takashi Ito, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 212 days.

(21) Appl. No.: 13/021,168

(22) Filed: Feb. 4, 2011

(65) Prior Publication Data

US 2011/0194344 A1 Aug. 11, 2011

(30) Foreign Application Priority Data

Feb. 9, 2010 (JP) ................. 2010-026707

(51) Int. Cl.
*G11C 8/00* (2006.01)
(52) U.S. Cl.
USPC ................. 365/230.03; 365/185.23
(58) Field of Classification Search
USPC ........................ 365/185.23, 230.06
See application file for complete search history.

(56) References Cited

U.S. PATENT DOCUMENTS

| | | |
|---|---|---|
| 5,652,450 A | 7/1997 | Hirano |
| 5,898,616 A | 4/1999 | Ono |
| 2001/0020840 A1 | 9/2001 | Kojima |
| 2004/0212014 A1 | 10/2004 | Fujito et al. |
| 2008/0232173 A1* | 9/2008 | Chen .................. 365/185.23 |
| 2009/0161474 A1* | 6/2009 | Scheuerlein et al. .... 365/230.06 |

FOREIGN PATENT DOCUMENTS

| | | |
|---|---|---|
| JP | 9-055093 A | 2/1997 |
| JP | 10-312694 A | 11/1998 |
| JP | 2001-243786 | 9/2001 |
| JP | 2003-077283 | 3/2003 |

OTHER PUBLICATIONS

Japanese Office Action with English translation issued in Japanese Application No. 2010-026707 mailed May 7, 2013.

* cited by examiner

*Primary Examiner* — Hoai V Ho

(57) ABSTRACT

To provide a semiconductor device that can suppress deterioration in transistors and has a small layout area. In a nonvolatile semiconductor memory device according to the present invention, a control voltage (4 V) between a write voltage (10 V) and a reference voltage (0 V) is applied to a gate of a P-channel MOS transistor of a memory gate drive circuit corresponding to a selected memory gate line and also the reference voltage (0 V) is applied to a gate of an N-channel MOS transistor, and the write voltage is applied to the memory gate line. Since the transistors are turned on with a gate-source voltage lower than the conventional one, deterioration in the transistors can be suppressed.

7 Claims, 19 Drawing Sheets

SEMICONDUCTOR DEVICE WITH TRANSISTOR STORING DATA BY CHANGE IN LEVEL OF THRESHOLD VOLTAGE

CROSS-REFERENCE TO RELATED APPLICATION

The disclosure of Japanese Patent Application No. 2010-26707 filed on Feb. 9, 2010 including the specification, drawings and abstract is incorporated herein by reference in its entirety.

BACKGROUND OF THE INVENTION

The present invention relates to semiconductor devices, and in particular, relates to a semiconductor device comprising a memory transistor which stores data by a change in the level of a threshold voltage.

Conventionally, a nonvolatile semiconductor memory device (semiconductor device) comprises a plurality of memory transistors and a drive circuit provided corresponding to each memory transistor. Each drive circuit includes a P-type transistor whose source receives a positive voltage higher than a power supply voltage and whose drain is coupled to a gate of the corresponding memory transistor, and an N-type transistor whose drain is coupled to the gate of the corresponding memory transistor and whose source receives a reference voltage. The gate of the P-type transistor and the gate of the N-type transistor are coupled to each other.

In a write operation, a reference voltage is applied to the gates of two transistors of the drive circuit corresponding to a selected memory transistor of the memory transistors. Thus, the P-type transistor is turned on and the N-type transistor is turned off, and a positive voltage is applied to the gate of the selected memory transistor and data is written (e.g., see Japanese Patent Laid-Open No. 2001-243786 (Patent Document 1)).

Moreover, there is a nonvolatile semiconductor device that separates the gate of the P-type transistor from the gate of the N-type transistor of the drive circuit to separately control these two transistors. In this device, in switching the output voltage of the drive circuit, one transistor in a conductive state of the two transistors is caused to transition to a non-conductive state and subsequently the other transistor in a non-conductive state is caused to transition to a conductive state. Thus, the breakdown of the transistors can be prevented (e.g., see Japanese Patent Laid-Open No. 2003-77283 (Patent Document 2)).

SUMMARY OF THE INVENTION

However, the conventional nonvolatile semiconductor memory device has a problem that the transistors deteriorate quickly because each of the transistors of the drive circuit is turned on by the application of a high voltage between the gate and source thereof.

As a method of suppressing the deterioration in the transistors, a method of constituting the drive circuit with high voltage transistors or a method of inserting a voltage relaxation transistor into the drive circuit may be contemplated. However, because the number of drive circuits is large, these methods significantly increase the layout area.

Therefore, a main object of the present invention is to provide a semiconductor device that can suppress the deterioration in transistors and has a small layout area.

A semiconductor device according to the present invention comprises: a plurality of memory transistors each storing data by a change in a level of a threshold voltage; a P-type transistor provided corresponding to each of the memory transistors, and having a source receiving a first voltage and a drain coupled to a gate of the corresponding memory transistor; an N-type transistor provided corresponding to each of the memory transistors, and having a drain coupled to the gate of the corresponding memory transistor and a source receiving a second voltage, which is lower than the first voltage; and a voltage control circuit rewriting data of a selected memory transistor of the memory transistors by applying a third voltage, which is a voltage between the first voltage and the second voltage, to the gate of one of the P-type transistor and the N-type transistor corresponding to each of the memory transistors and further applying the first or second voltage to the gate of the other transistor.

In the semiconductor device according to the present invention, data of a memory transistor is rewritten by applying the third voltage, which is a voltage between the first voltage and the second voltage, to the gate of one of the P-type transistor and the N-type transistor and applying the first or second voltage to the gate of the other transistor. Since the transistor is turned on by a gate-source voltage lower than the conventional one, deterioration in the transistors can be suppressed without increasing the layout area.

DETAILED DESCRIPTION OF PREFERRED EMBODIMENTS

Figure 1:
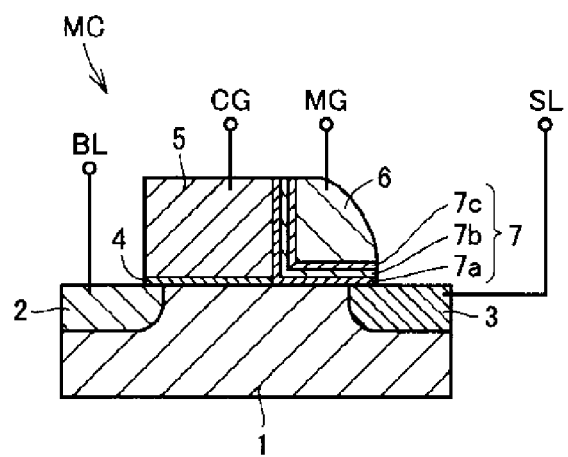
FIG. 1 is a cross sectional view showing a configuration of a memory cell included in a nonvolatile semiconductor device according to an embodiment of the present invention.

FIG. 1 is a cross sectional view showing a configuration of a memory cell MC included in a nonvolatile semiconductor memory device according to an embodiment of the present invention. In FIG. 1, the memory cell MC comprises: impurity regions 2, 3 formed at a distance from each other over a semiconductor substrate region 1; a selection gate 5 formed in a surface of the semiconductor substrate region 1 via a gate insulating film 4 so as to overlap with a part of the impurity region 2; an insulating film 7 formed on a side wall of the selection gate 5 and over the surface of the semiconductor substrate region 1; and a memory gate 6 formed over the insulating film 7.

The impurity regions 2, 3 are coupled to a bit line BL and a source line SL, respectively. The selection gate 5 and the memory gate 6 are coupled to a selection gate line CG and a memory gate line MG, respectively. The memory gate 6 is formed using the same method as that used in forming a side wall spacer of the selection gate 5. That is, for example, a polysilicon film is deposited over the selection gate 5, and this polysilicon film is patterned by etching. The length of the memory gate can be adjusted using the film thickness of this polysilicon film. Accordingly, also in a configuration wherein two gates, i.e., the selection gate 5 and the memory gate 6, are provided, the length of the memory gate 6 can be made sufficiently short as compared with that of the selection gate 5, which sufficiently suppresses an increase in the memory cell size.

The insulating film 7 has a laminated structure of a bottom oxide film (O film) 7a, a nitride film (N film) 7b, and a top oxide film (O film) 7c. A charge is accumulated in the nitride film 7b, and data (information) is stored according to the amount of the accumulated charge. In this memory cell MC, a selection transistor ST is formed of the selection gate 5, the impurity region 2, and the semiconductor substrate region 1, while a memory transistor MT is formed of the memory gate 6, the impurity region 3, and the semiconductor substrate region 1.

Figure 2:
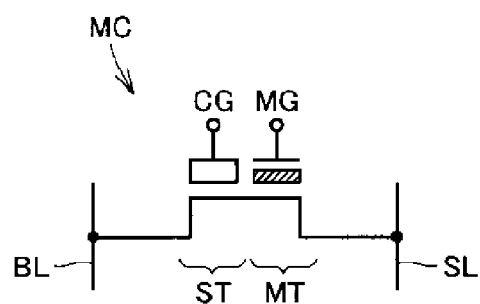
FIG. 2 is a view showing an equivalent circuit of the memory cell shown in FIG. 1.

FIG. 2 is a view showing an electrically equivalent circuit of the memory cell MC. As shown in FIG. 2, the selection transistor ST and the memory transistor MT are coupled in series between the bit line BL and the source line SL. The data write (program), erase, read, and hold of this memory cell MC are performed as follows.

In the write operation, a positive voltage is supplied to the impurity region 3 via the source line SL, while to the memory gate 6, a memory gate write voltage higher than the voltage of the source line SL is applied via the memory gate line MG. A voltage slightly higher than the threshold voltage of the selection transistor ST is applied to the selection gate 5 via the selection gate line CG. A bit line write voltage, e.g., a ground voltage level, with the same voltage level as that of the semiconductor substrate region 1 is supplied to the bit line BL.

In this state, in the memory transistor MT, a channel is formed under the insulating film 7 and a current flows from the source line SL toward the bit line BL. The selection transistor ST is in a weak on-state because the voltage of the selection gate 5 is set to a voltage level slightly higher than the threshold voltage. Accordingly, even if the channel is formed under the selection gate 5, the channel resistance is relatively high. For this reason, a strong electric field is generated in the vicinity of a boundary between the memory transistor MT and the selection transistor ST, and a large number of hot electrons are generated in the channel current of the memory transistor MT. These hot electrons are injected into the insulating film 7 (nitride film 7b) under the memory gate 6 and are trapped therein. This write (program) state is a state where the threshold voltage of the memory transistor MT is high, and is usually associated with a state where the data "0" is stored.

In the erase operation, a negative voltage is supplied to the memory gate 6 via the memory gate line MG. A positive voltage is supplied to the impurity region 3 via the source line SL. The selection gate line CG, the bit line BL, and the semiconductor substrate region 1 are set to an identical voltage, and thus the selection transistor ST is in an off-state. In this state, a strong inversion occurs in a region where an end portion of the impurity region 3 coupled to the source line SL of the memory gate 6 overlaps with the memory gate 6, and band-to-band tunneling occurs to generate a hole. The generated hole (hot hole) is accelerated by the negative bias of the memory gate 6 and is injected into the insulating film 7 (nitride film 7b) under the memory gate 6. The electron already injected during writing is combined with the injected hole, and the nitride film 7b is electrically neutralized and the threshold voltage of the memory transistor MT decreases. This erase state is a state where the threshold voltage of the memory transistor MT is low and is usually associated with a state where the data "1" is stored.

In the data read operation, a positive voltage is applied to the selection gate 5 via the selection gate line CG to form a channel in the surface of the semiconductor substrate region 1 directly under the selection gate 5. To the memory gate 6, a positive voltage between the threshold voltage in the erase state and the threshold voltage in the write state is applied via the memory gate line MG. The channel is selectively formed in the surface of the semiconductor substrate region 1 under the memory gate 6 according to the charge amount accumulated in the insulating film 7. The stored data of the memory cell MC is read by detecting the amount of a current flowing through the memory cell between the bit line BL and the source line SL.

In the hold state (standby state), the data is held as the charge (electron or hole) injected into the insulating film 7 under the memory gate 6. The charge movement in this insulating film (nitride film 7b) is small and slow. Thus, in the state where no voltage is applied to the memory gate 6, the charge is held in the insulating film 7, i.e., the nitride film 7b.

Figure 3:
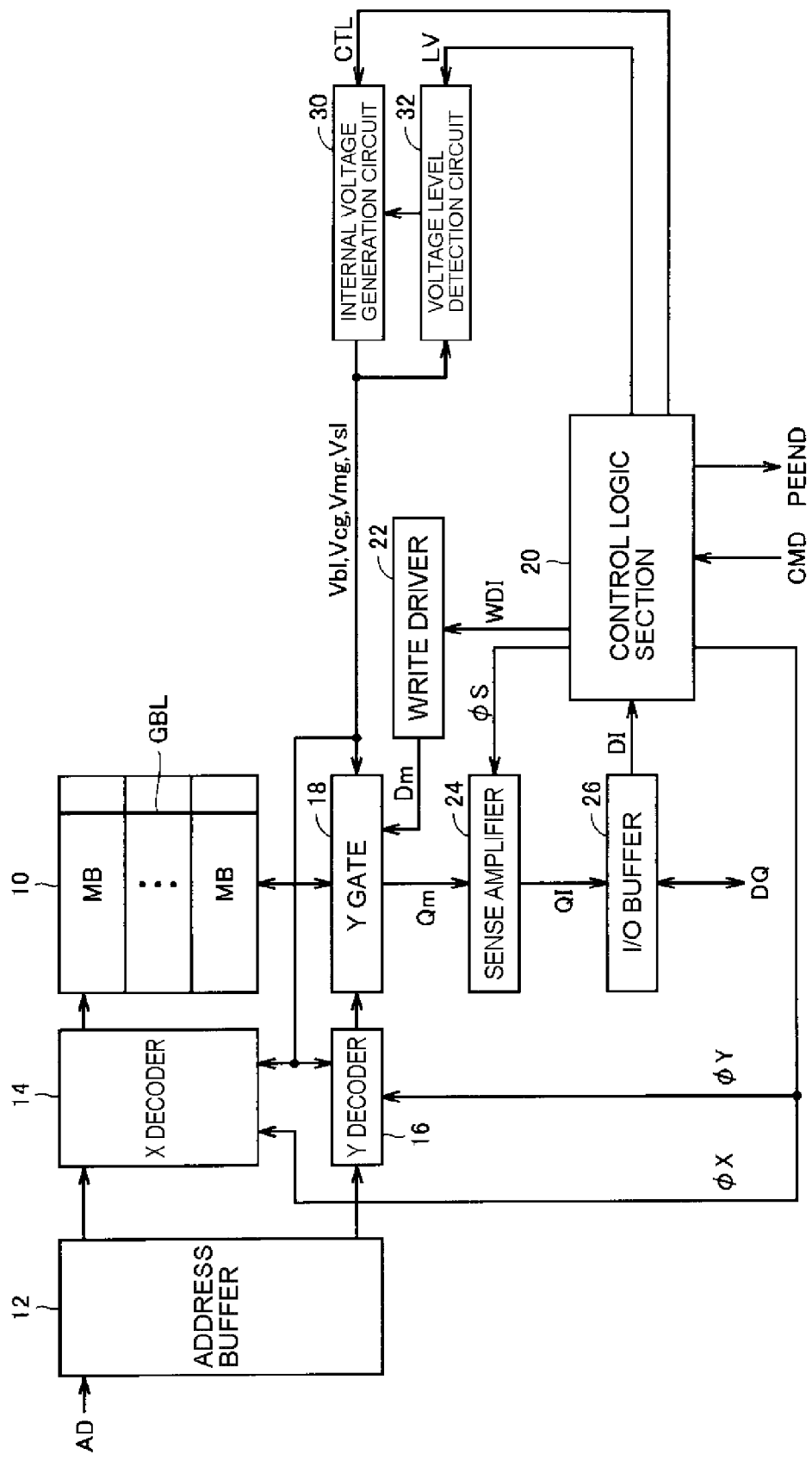
FIG. 3 is a block diagram showing an overall configuration of the nonvolatile semiconductor device comprising the memory cell shown in FIG. 1.

FIG. 3 is a block diagram schematically showing the overall configuration of this nonvolatile semiconductor memory device. In FIG. 3, this nonvolatile semiconductor memory device comprises a memory mat 10 in which a plurality of memory cells MC is arranged, an address buffer 12 which generates an address designating a memory cell MC of the memory mat 10, and an X decoder 14 and a Y decoder 16 which select an addressed memory cell of the memory mat 10 according to an internal address from the address buffer 12.

The memory mat 10 is divided into a plurality of memory blocks MB, and each MB includes a plurality of memory cells MC. The memory cell MC included in the memory block MB has the configuration shown in FIG. 1 and FIG. 2. In the memory block MB, the control gate line CG and the memory gate line MG are arranged corresponding to each memory cell row, and the source line SL is arranged corresponding to each memory cell row. The common bit line BL is arranged corresponding to each memory cell column. A global bit line GBL common to the memory blocks MB is arranged corresponding to each memory cell column. The voltage level in the selection state of each signal line differs according to the operation mode.

During an access to this nonvolatile semiconductor memory device (during erasing, writing, and reading), the address buffer 12 generates an internal address according to a given address AD. The X decoder 14 drives a memory cell row of the memory mat 10 into a selection state according to an internal address signal from the address buffer 12.

This nonvolatile semiconductor memory device further comprises a Y gate 18 selecting a memory cell column (global bit line GBL) of the memory mat 10. The Y gate 18 selects the global bit line GBL corresponding to an addressed column of the memory mat 10 according to a row selection signal from the Y decoder 16. In the erase operation mode, the Y gate 18 is kept in a non-conductive state.

This nonvolatile semiconductor memory device further comprises a control logic section 20 controlling internal operations, a write driver 22 generating internal write data Dm in the write operation, a sense amplifier 24 generating internal read data QI according to memory cell data (bit line current) Qm in the read operation, and an I/O buffer 26 performing input/output of data from/to the outside. The control logic section 20 includes a sequence controller, for example, and according to a command CMD designating an operation mode from the outside, the control logic section 20 performs an internal operation control required for execution of a designated operation mode.

The write driver 22 generates the write data Dm for the memory cell MC according to internal write data WDI from the control logic section 20. The write data Dm from the write driver 22 is supplied to the bit line BL of a selected column via the Y gate 18. When the memory cell MC is set to the write state (program state) according to the write data Dm for the memory cell MC, the bit line BL of the selected column is set to a ground voltage level, for example, and the data "0" is written. The bit line BL for the memory cell MC to be kept in the erase state is set to a voltage level equivalent to that of the selection memory gate line MG.

The sense amplifier 24 detects the current (cell data) Qm flowing through the memory cell column (bit line BL) which is selected via the Y gate 18 according to a sense control signal φS from the control logic section 20, and generates the internal read data QI according to the detection result. In the read operation, the I/O buffer 26 generates external read data DQ according to the internal read data QI from the sense amplifier 24, while in the write operation, it generates internal write data DI according to the write data DQ from the outside and provides it to the control logic section 20.

This nonvolatile semiconductor memory device further comprises an internal voltage generation circuit 30 generating an internal voltage which is required according to each operation mode, and a voltage level detection circuit 32 detecting the level of an internal voltage which the internal voltage generation circuit 30 generates.

The internal voltage generation circuit 30 generates a bit line voltage Vbl transmitted to the bit line BL, a selection gate voltage Vcg supplied to the selection gate line CG, a memory gate voltage Vmg supplied to the memory gate line MG, and a source line voltage Vsl supplied to the source line SL. This internal voltage generation circuit 30 generates an internal voltage in response to the control signal CTL from the control logic section 20.

According to each operation mode, the voltage level detection circuit 32 adjusts the level of an internal voltage, which the internal voltage generation circuit 30 generates, according to a voltage level designating signal LV from the control logic section 20. That is, the voltage level detection circuit 32 sets a detection voltage level according to the voltage level designating signal LV, detects whether the voltage level of the internal voltage which the internal voltage generation circuit 30 generates is in a designated voltage level, and controls the internal voltage generation operation of the internal voltage generation circuit 30 according to this detection result.

Figure 4:
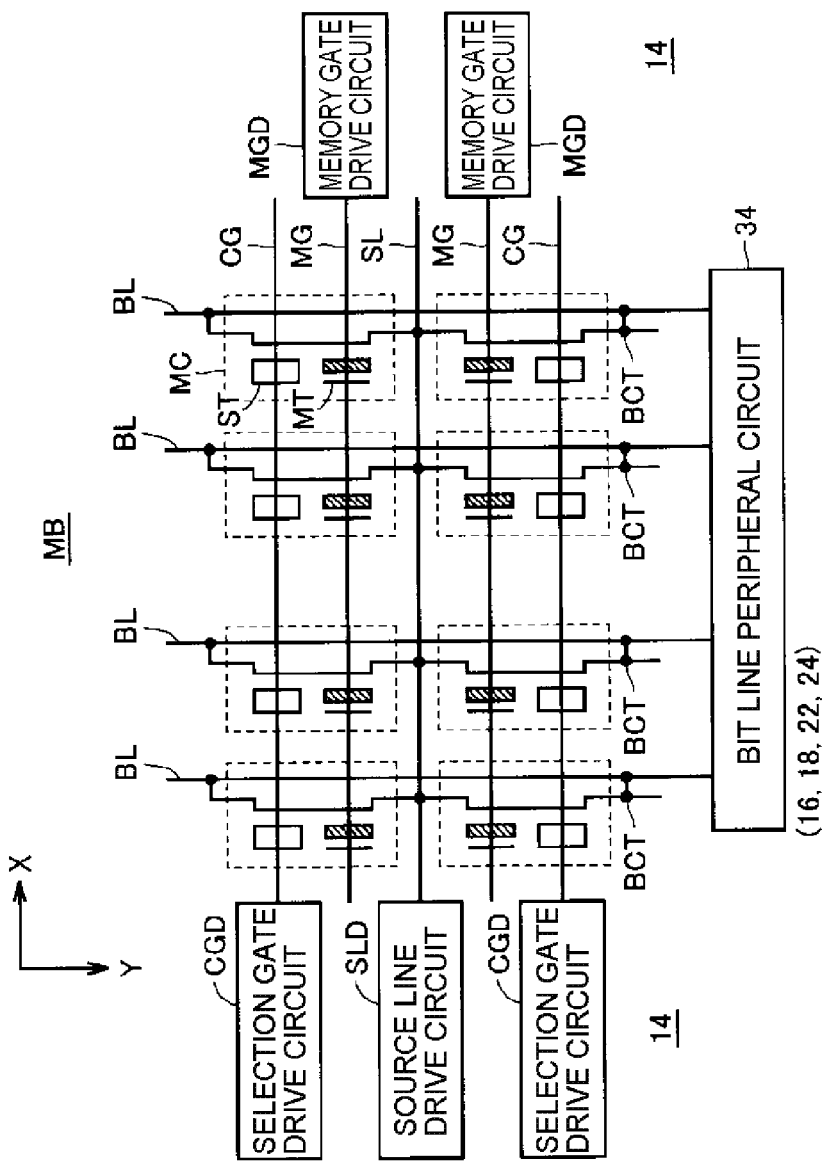
FIG. 4 is a circuit block diagram showing a memory block shown in FIG. 3, and the peripheral circuit.

FIG. 4 is a view showing a configuration of the memory block MB and a configuration of the peripheral circuit. Although the memory block MB actually includes a large number of memory cells MC, eight memory cells MC of 2 rows by 4 columns are shown for simplification of the drawing in FIG. 4.

The memory cell MC includes a series-connected body of the selection transistor ST and the memory transistor MT, as shown in FIG. 1 and FIG. 2. The selection gate line CG is provided commonly to the selection transistors ST of four memory cells MC aligned in the X direction, and the memory gate line MG is arranged commonly to the memory transistor MT of four memory cells MC aligned in the X direction.

The bit line BL is provided commonly to two memory cells MC aligned in the Y direction. The bit line BL is coupled to the selection transistor ST of the memory cell MC of a corresponding column via a bit line contact BCT. Moreover, each bit line BL is coupled to the global bit line GBL of the corresponding column. The source line SL is provided commonly to eight memory cells MC arranged in two rows.

A selection gate drive circuit CGD is provided for each selection gate line CG, and a source line drive circuit SLD is provided for the source line SL, and a memory gate drive circuit MGD is provided for each memory gate line MG. The selection gate drive circuit CGD sets the voltage level of a corresponding selection gate line CG. The source line drive circuit SLD sets the voltage level of the corresponding source line SL. The memory gate drive circuit MGD sets the voltage level of the corresponding memory gate line MG. The selection gate drive circuit CGD, the source line drive circuit SLD, and the memory gate drive circuit MGD are included in the X decoder 14 shown in FIG. 3.

A bit line peripheral circuit 34 is provided for four bit lines BL. The bit line peripheral circuit 34 performs data rewrite/read via the bit line BL. The bit line peripheral circuit 34 includes the global bit line GBL, the Y decoder 16, the Y gate 18, the sense amplifier 24, and the write driver 22.

Figure 5:
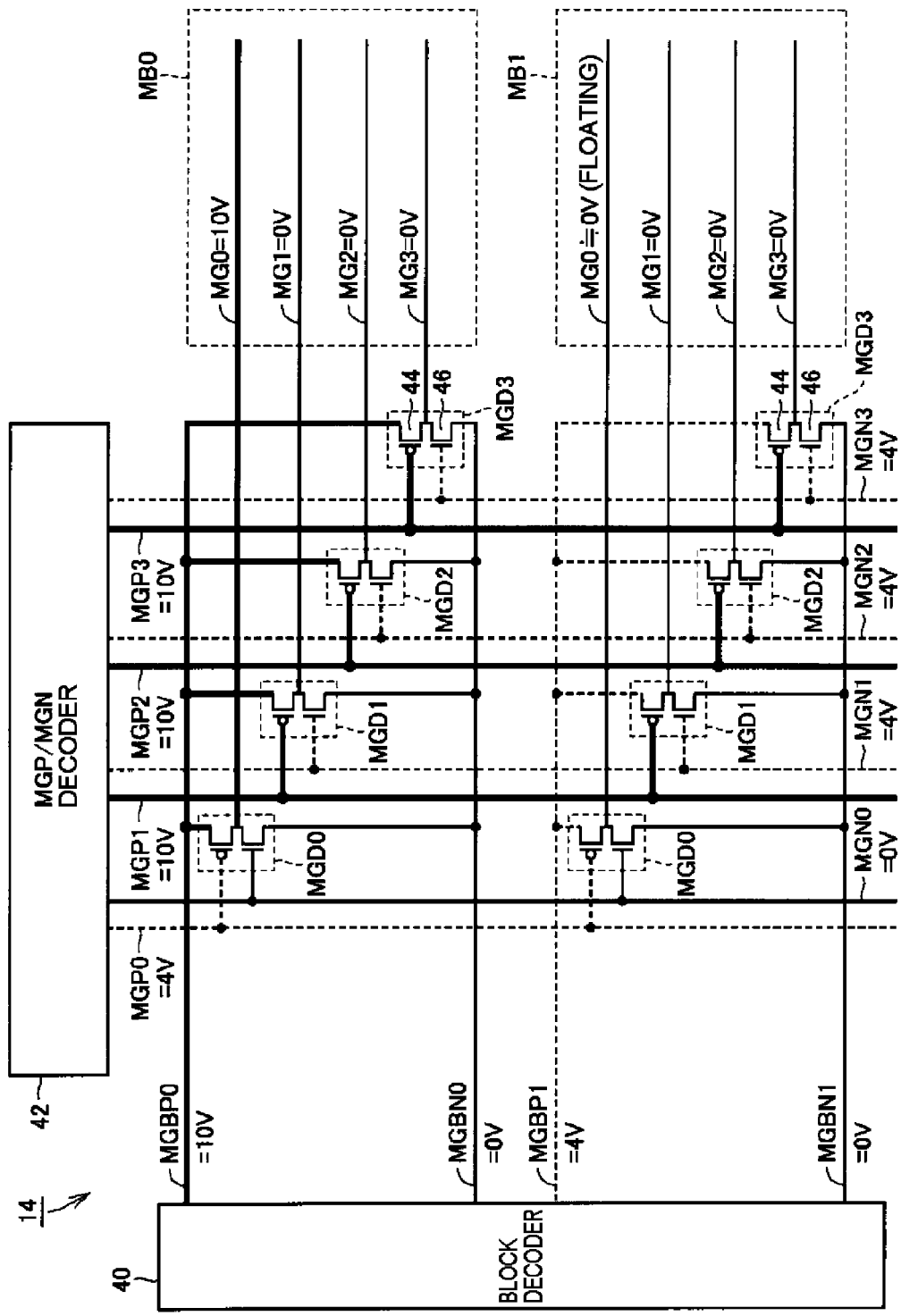
FIG. 5 is a circuit block diagram showing a configuration of an X decoder shown in FIG. 3, and an operation in a write mode.

Hereinafter, a method of driving the memory gate line MG which is a feature of the present application is described. FIG. 5 is a circuit block diagram showing the configuration of a portion involved in driving the memory gate line MG of the X decoder 14 shown in FIG. 3. In FIG. 5, two memory blocks MB0, MB1 of the memory blocks MB are representatively shown. Moreover, four memory gate lines MG0-MG3 of the memory gate lines MG of each memory block MB are representatively shown.

The X decoder 14 includes: a block decoder 40; voltage control lines MGBP0 and MGBP1 respectively provided corresponding to the memory blocks MB0 and MB1, and voltage control lines MGBN0 and MGBN1 respectively provided corresponding to the memory blocks MB0 and MB1. The voltage control lines MGBP0, MGBP1, MGBN0, and MGBN1 extend in the same direction as that of the memory gate line MG. The block decoder 40 sets each voltage of the voltage control lines MGBP0, MGBP1, MGBN0, and MGBN1.

Moreover, the X decoder 14 includes an MGP/MGN decoder 42, four voltage control lines MGP0-MGP3, and four voltage control lines MGN0-MGN3. The voltage control lines MGP0-MGP3 are provided commonly to two memory blocks MB0 and MB1 corresponding to the memory gate lines MG0-MG3, respectively. The voltage control lines MGN0-MGN3 are provided commonly to two memory blocks MB0 and MB1 corresponding to the memory gate lines MG0-MG3, respectively. The voltage control lines MGP0-MGP3 and MGN0-MGN3 cross the voltage control lines MGBP0, MGBP1, MGBN0, and MGBN1. The MGP/MGN decoder 42 sets the respective voltages of the voltage control lines MGP0-MGP3 and MGN0-MGN3.

Moreover, the X decoder 14 includes memory gate drive circuits MGD0-MGD4 respectively corresponding to the memory gate lines MG0-MG3 of the memory block MB0, and memory gate drive circuits MGD0-MGD4 respectively corresponding to the memory gate lines MG0-MG3 of the memory block MB1. Each memory gate drive circuit MGD includes a P-channel MOS transistor 44 and an N-channel MOS transistor 46.

The source of the P-channel MOS transistor 44 is coupled to the corresponding voltage control line MGBP, the drain is coupled to the corresponding memory gate line MG, and the gate is coupled to the corresponding voltage control line MGP. The source of the N-channel MOS transistor 46 is coupled to the corresponding voltage control line MGBN, the drain is coupled to the corresponding memory gate line MG, and the gate is coupled to the corresponding voltage control line MGN.

Next, the operation of the decoders 40 and 42 in the write mode is described. Here, assume that the memory gate line MG0 of the memory block MB0 has been selected. The block decoder 40 applies a positive write voltage (e.g., 10 V) to the voltage control line MGBP0 corresponding to the selected memory block MB0 and also applies a reference voltage (e.g., 0 V) to the voltage control line MGBN0 corresponding to the memory block MB0. Moreover, the block decoder 40 applies a control voltage (a voltage in the range from 3 V to 7 V, e.g., 4V) between the write voltage and the reference voltage to the voltage control line MGBP1 corresponding to the non-selected memory block MB1 and also applies a reference voltage (e.g., 0 V) to the voltage control line MGBN1 corresponding to the memory block MB1.

The MGP/MGN decoder 42 applies the control voltage (4 V in this case) to the voltage control line MGP0 corresponding to the selected memory gate line MG0 and also applies a reference voltage (0 V in this case) to the voltage control line MGN0 corresponding to the memory gate line MG0. Moreover, the MGP/MGN decoder 42 applies a write voltage (10 V in this case) to each of the voltage control lines MGP1-MGP3 corresponding to the non-selected memory gate lines MG1-MG3 and also applies the control voltage (4 V in this case) to each of the voltage control lines MGN1-MGN3 corresponding to the memory gate lines MG1-MG3.

In the memory gate drive circuit MGD0 corresponding to the selected memory gate line MG0 of the selected memory block MB0, the P-channel MOS transistor 44 is turned on and the N-channel MOS transistor 46 is turned ff, and the write voltage (10 V in this case) is applied to the memory gate line MG0. Thus, data write is performed on the memory cell MC of a selected column of the memory cells MC corresponding to the memory gate line MG0.

Moreover, in the memory gate drive circuits MGD1-MGD3 corresponding to the non-selected memory gate lines MG1-MG3 of the selected memory block MB0, the P-channel MOS transistor 44 is turned off and the N-channel MOS transistor 46 is turned on, and the reference voltage (0 V in this case) is applied to each of the memory gate lines MG1-MG3. Thus, data rewrite is not performed in each memory cell MC corresponding to the memory gate lines MG1-MG3.

Moreover, in the memory gate drive circuits MGD1-MGD3 corresponding to the non-selected memory gate lines MG1-MG3 of the non-selected memory block MB1, the P-channel MOS transistor 44 is turned off and the N-channel MOS transistor 46 is turned on, and the reference voltage (0 V in this case) is applied to each of the memory gate lines MG1-MG3. Thus, data rewrite is not performed in each memory cell MC corresponding to these memory gate lines MG1-MG3.

In the memory gate drive circuit MGD0 corresponding to the selected memory gate line MG0 of the non-selected memory block MB1, both the P-channel MOS transistor 44 and the N-channel MOS transistor 46 are turned off, and the memory gate line MG0 is set to a floating state. In the standby state, since each memory gate line MG is kept at the reference voltage (0 V in this case), even if both the P-channel MOS transistor 44 and the N-channel MOS transistor 46 are turned off, the memory gate line MG0 is kept approximately at the reference voltage (0 V in this case). Thus, data rewrite is not performed in each memory cell MC corresponding to the memory gate line MG0.

Figure 6:
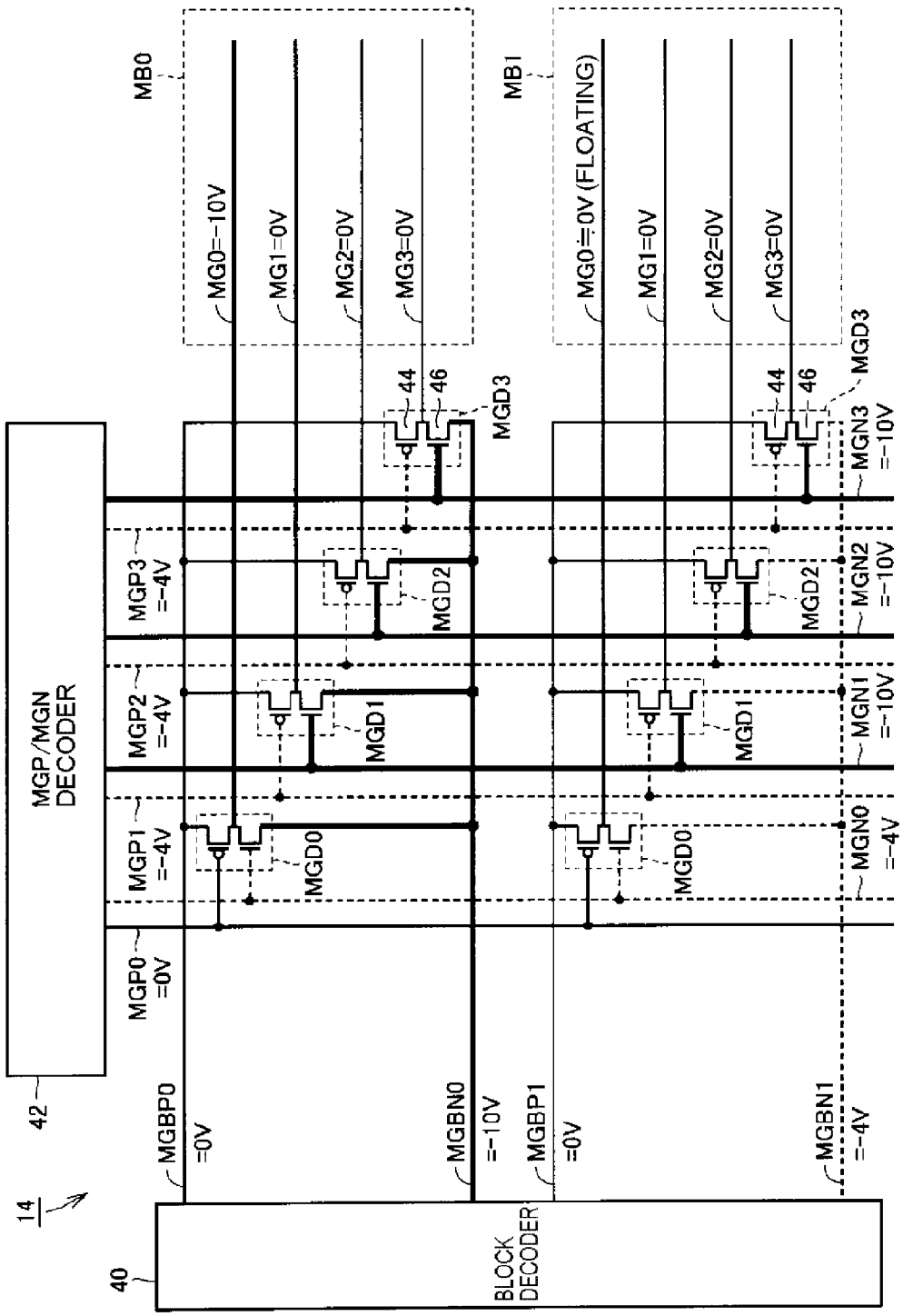
FIG. 6 is a circuit block diagram showing an operation in an erase mode of the X decoder shown in FIG. 5.
Figure 7:
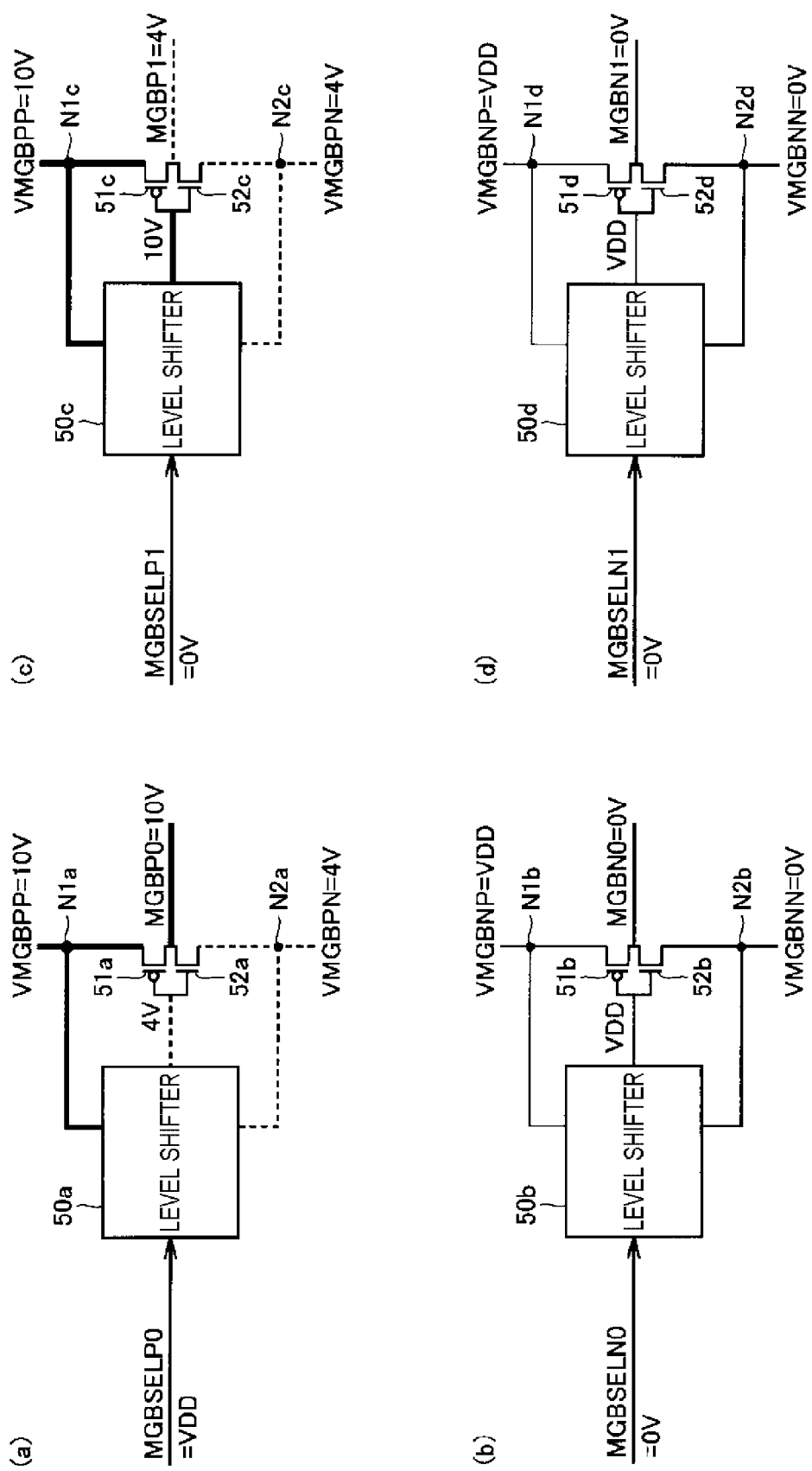
FIGS. 7A to 7D are circuit block diagrams each showing a configuration of a block decoder shown in FIG. 5, and an operation in the write mode.
Figure 8:
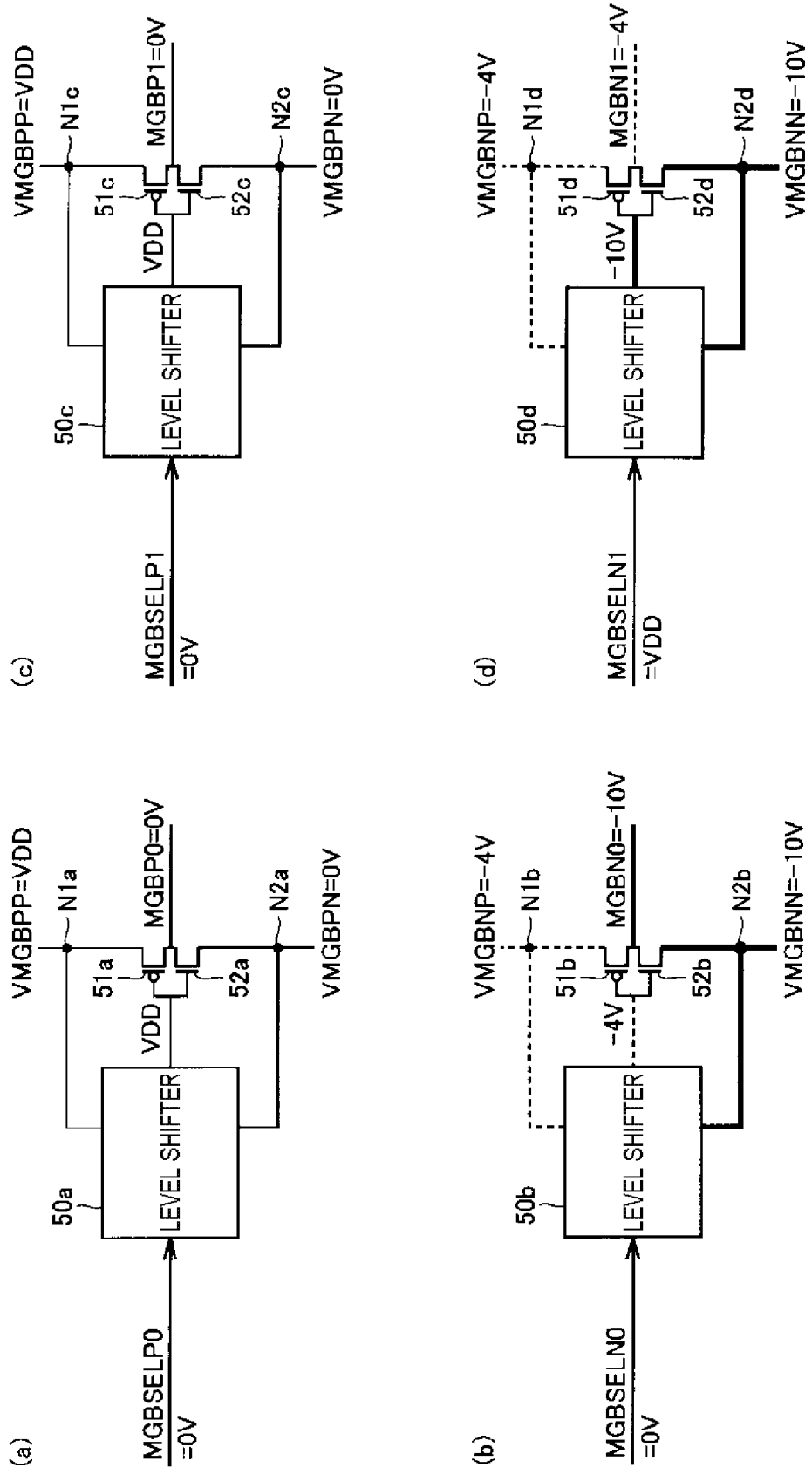
FIGS. 8A to 8D are circuit block diagrams each showing an operation in the erase mode of the block decoder shown in FIG. 7A.
Figure 9:
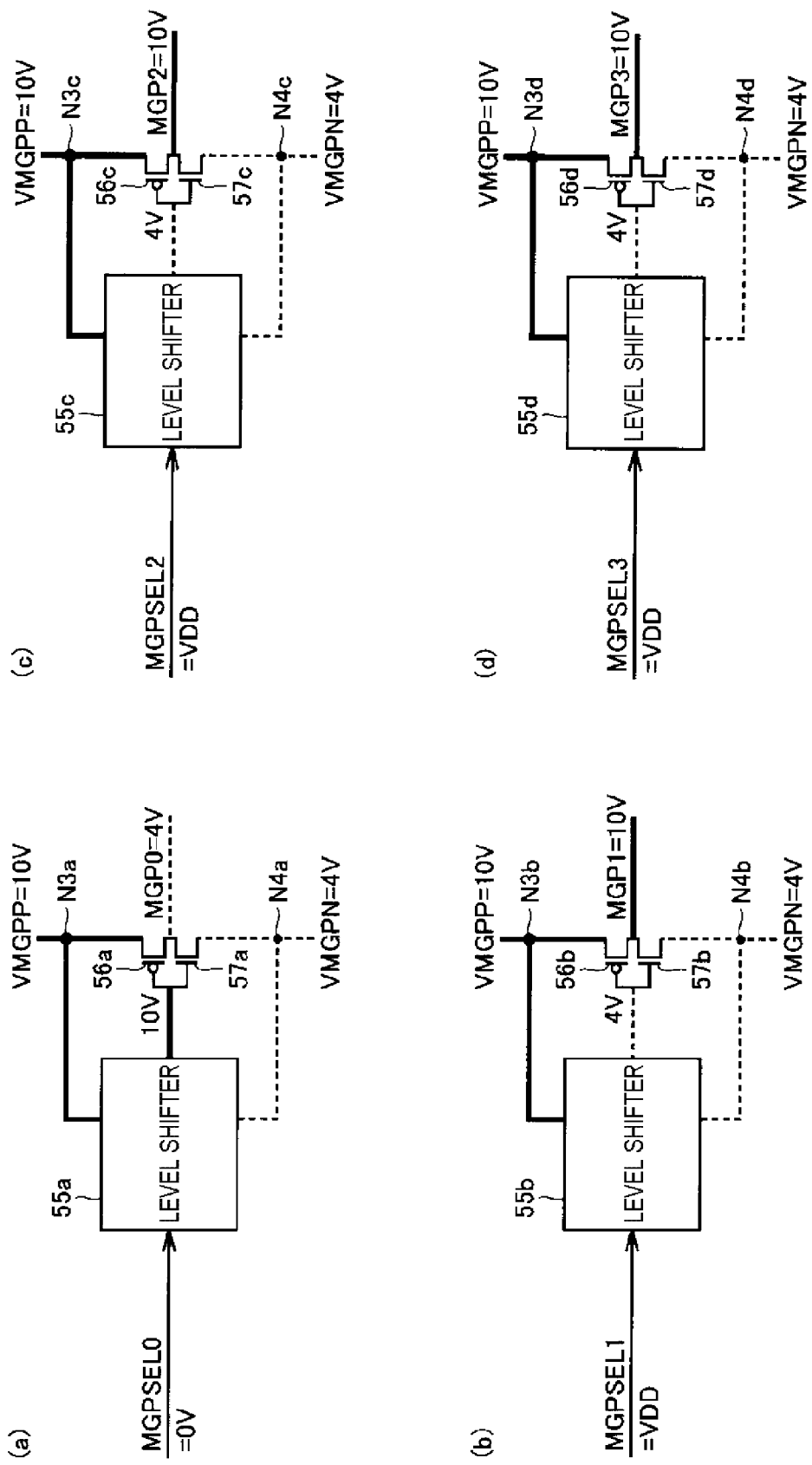
FIGS. 9A to 9D are circuit block diagrams each showing a configuration of a portion related to a voltage control line MGP of an MGP/MGN decoder shown in FIG. 5, and an operation in the write mode.
Figure 10:
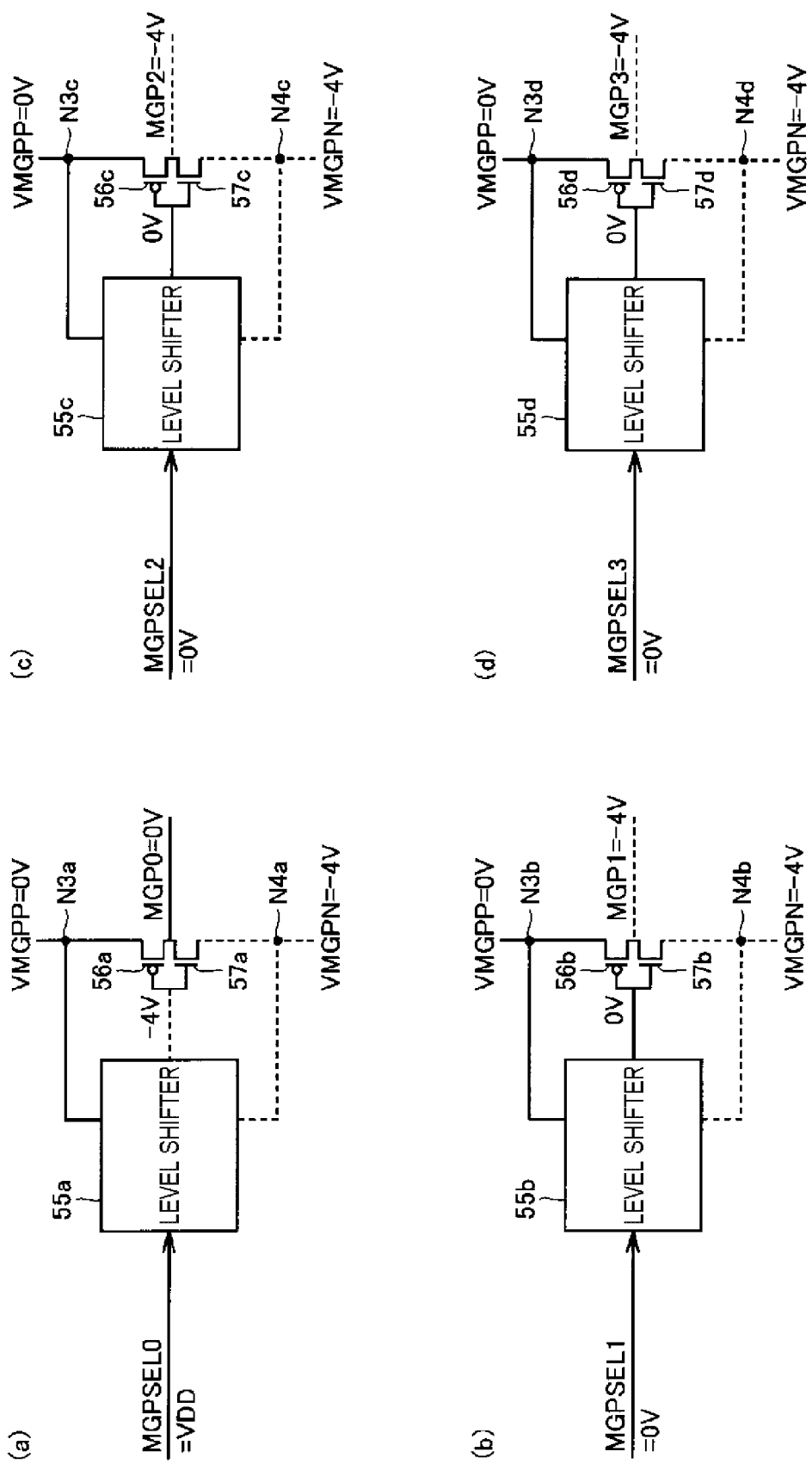
FIGS. 10A to 10D are circuit block diagrams each showing an operation in the erase mode of the MGP/MGN decoder shown in FIGS. 9A to 9D.
Figure 11:
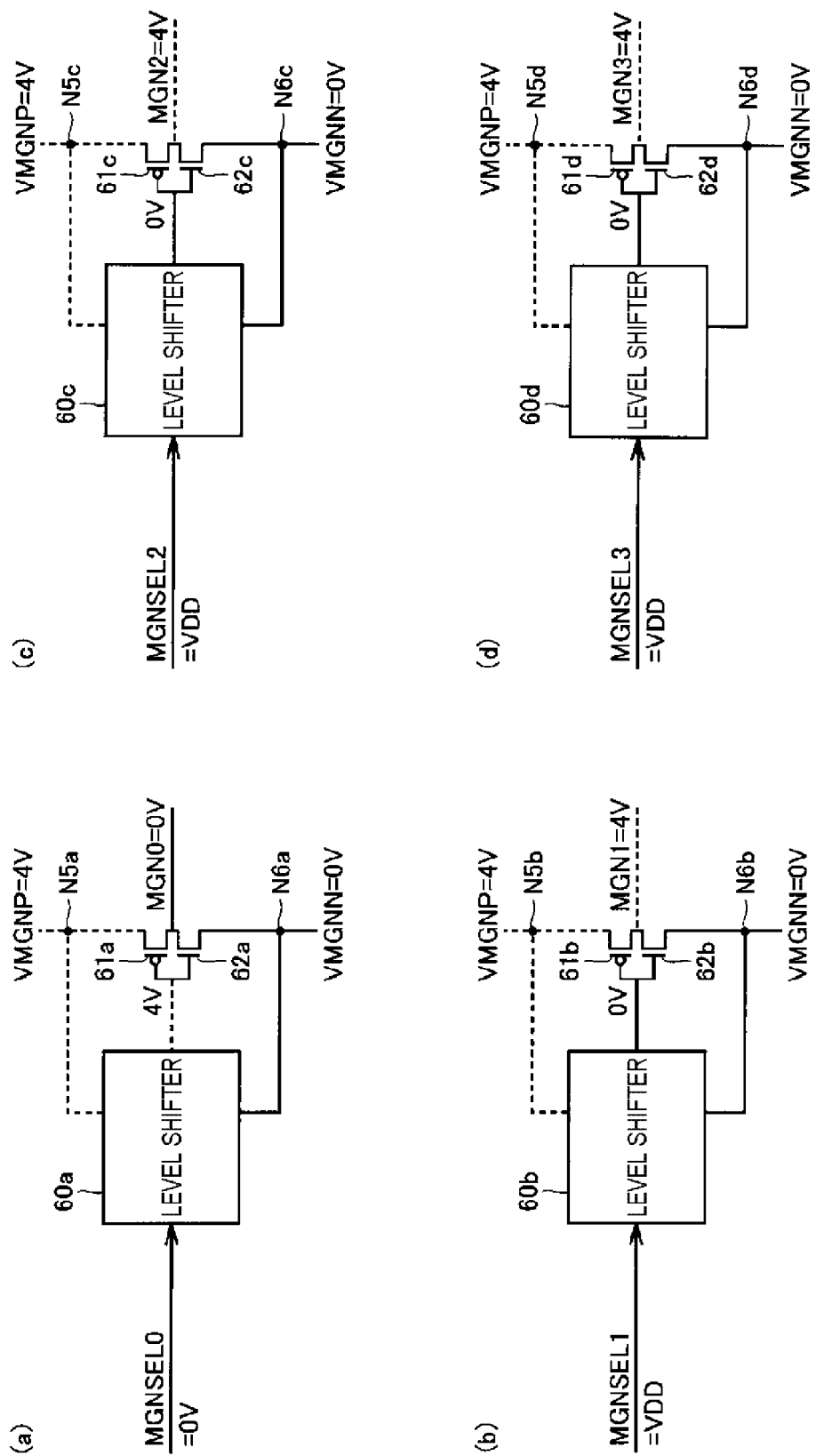
FIGS. 11A to 11D are circuit block diagrams each showing a configuration of a portion related to a voltage control line MGN of the MGP/MGN decoder shown in FIG. 5, and an operation in the write mode.
Figure 12:
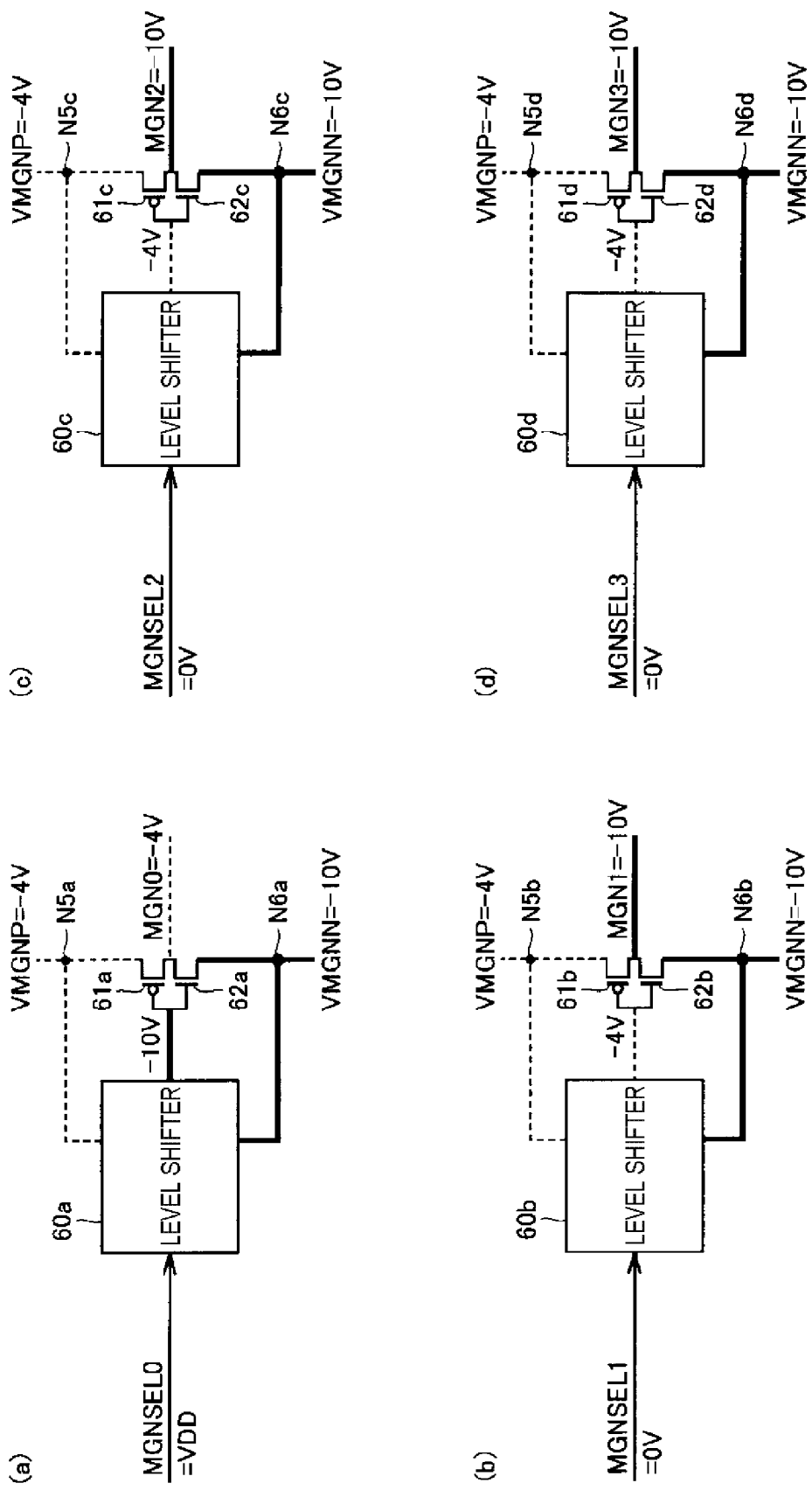
FIGS. 12A to 12D are circuit block diagrams each showing an operation in the erase mode of the MGP/MGN decoder shown in FIGS. 11A to 11D.

FIG. 6 is a circuit block diagram showing an operation of the decoders 40, 42 in the erase mode. Here, assume that the memory gate line MG0 of the memory block MB0 has been selected. The block decoder 40 applies a negative erase voltage (e.g., −10 V) to the voltage control line MGBN0 corresponding to the selected memory block MB0 and also applies the reference voltage (e.g., 0 V) to the voltage control line MGBP0 corresponding to the memory block MB0. Moreover, the block decoder 40 applies a control voltage (a voltage in the range from −3 V to −7 V, e.g., −4 V) between the reference voltage and the erase voltage to the voltage control line MGBN1 corresponding to the non-selected memory block MB1 and also applies the reference voltage (e.g., 0 V) to the voltage control line MGBP1 corresponding to the memory block MB1.

The MGP/MGN decoder 42 applies the above-described reference voltage (0 V in this case) to the voltage control line MGP0 corresponding to the selected memory gate line MG0 and also applies the above-described control voltage (−4 V in this case) to the voltage control line MGN0 corresponding to the memory gate line MG0. Moreover, the MGP/MGN decoder 42 applies the above-described control voltage (−4 V in this case) to each of the voltage control lines MGP1-MGP3 corresponding to the non-selected memory gate lines MG1-MG3 and also applies the above-described erase voltage (−10 V in this case) to each of the voltage control lines MGN1-MGN3 corresponding to these memory gate lines MG1-MG3.

In the memory gate drive circuit MGD0 corresponding to the selected memory gate line MG0 of the selected memory block MB0, the P-channel MOS transistor 44 is turned off and the N-channel MOS transistor 46 is turned on, and the erase voltage (−10 V in this case) is applied to the memory gate line MG0. Thus, the data erase of the memory cell MC of a selected column of the memory cells MC corresponding to the memory gate line MG0 is performed.

Moreover, in the memory gate drive circuits MGD1-MGD3 corresponding to the non-selected memory gate lines MG1-MG3 of the selected memory block MB0, the P-channel MOS transistor 44 is turned on and the N-channel MOS transistor 46 is turned off, and the reference voltage (0 V in this case) is applied to each of the memory gate lines MG1-MG3. Thus, data rewrite is not performed in each memory cell MC corresponding to the memory gate lines MG1-MG3.

In the memory gate drive circuits MGD1-MGD3 corresponding to the non-selected memory gate lines MG1-MG3 of the non-selected memory block MB1, the P-channel MOS transistor 44 is turned on and the N-channel MOS transistor 46 is turned off, and the reference voltage (0 V in this case) is applied to each of the memory gate lines MG1-MG3. Thus, data rewrite is not performed in each memory cell MC corresponding to the memory gate lines MG1-MG3.

In the memory gate drive circuit MGD0 corresponding to the selected memory gate line MG0 of the non-selected memory block MB1, both the P-channel MOS transistor 44 and the N-channel MOS transistor 46 are turned off, and the memory gate line MG0 is set to a floating state. In the standby state, since each memory gate line MG is kept at the reference voltage (0 V in this case), even if both the P-channel MOS transistor 44 and the N-channel MOS transistor 46 are turned off, the memory gate line MG0 is kept approximately at the reference voltage (0 V in this case). Thus, data rewrite is not performed in each memory cell MC corresponding to the memory gate line MG0.

FIGS. 7A to 7D are circuit block diagrams each showing a configuration of the block decoder 40 shown in FIG. 5. In FIGS. 7A to 7D, the block decoder 40 includes level shifters 50a-50d, P-channel MOS transistors 51a-51d, N-channel MOS transistors 52a-52d, and power supply nodes N1a-N1d and N2a-N2d.

The level shifter 50a is driven by voltages VMGBPP, VMGBPN provided from the power supply nodes N1a, N2a, and outputs the inverted signal of a block selection PMOS side signal MGBSELP0. The source of the P-channel MOS transistor 51a is coupled to the power supply node N1a, the drain is coupled to the voltage control line MGBP0, and the gate receives the output signal of the level shifter 50a. The drain of the N-channel MOS transistor 52a is coupled to the voltage control line MGBP0, the source is coupled to the power supply node N2a, and the gate receives the output signal of the level shifter 50a. The transistors 51a, 52a constitute an inverter. This inverter is driven by the voltages VMGBPP, VMGBPN from the power supply nodes N1a, N2a, inverts the output signal of the level shifter 50a, and provides the inverted output signal to the voltage control line MGBP0.

The level shifter 50b is driven by the voltages VMGBNP, VMGBNN provided from the power supply nodes N1b, N2b, and outputs the inverted signal of a block selection NMOS side signal MGBSELN0. The source of the P-channel MOS transistor 51b is coupled to the power supply node N1b, the drain is coupled to the voltage control line MGBN0, and the gate receives the output signal of the level shifter 50b. The drain of the N-channel MOS transistor 52b is coupled to the voltage control line MGBN0, the source is coupled to the power supply node N2b, and the gate receives the output signal of the level shifter 50b. The transistors 51b, 52b constitute an inverter. This inverter is driven by the voltages VMGBNP, VMGBNN from the power supply nodes N1b, N2b, inverts the output signal of the level shifter 50b, and provides the inverted output signal to the voltage control line MGBN0.

The level shifter 50c is driven by the voltages VMGBPP, VMGBPN provided from the power supply nodes N1c, N2c, and outputs the inverted signal of a block selection PMOS side signal MGBSELP1. The source of the P-channel MOS transistor 51c is coupled to the power supply node N1c, the drain is coupled to the voltage control line MGBP1, and the gate receives the output signal of the level shifter 50c. The drain of the N-channel MOS transistor 52c is coupled to the voltage control line MGBP1, the source is coupled to the power supply node N2c, and the gate receives the output signal of the level shifter 50c. The transistors 51c, 52c constitute an inverter. This inverter is driven by the voltages VMGBPP, VMGBPN from the power supply nodes N1c, N2c, inverts the output signal of the level shifter 50c, and provides the inverted output signal to the voltage control line MGBP1.

The level shifter 50d is driven by the voltages VMGBNP, VMGBNN provided from the power supply nodes N1d, N2d, and outputs the inverted signal of a block selection NMOS side signal MGBSELN1. The source of the P-channel MOS transistor 51d is coupled to the power supply node N1d, the drain is coupled to the voltage control line MGBN1, and the gate receives the output signal of the level shifter 50d. The drain of the N-channel MOS transistor 52d is coupled to the voltage control line MGBN1, the source is coupled to the power supply node N2d, and the gate receives the output signal of the level shifter 50d. The transistors 51d, 52d constitute an inverter. This inverter is driven by the voltages VMGBNP, VMGBNN from the power supply nodes N1d, N2d, inverts the output signal of the level shifter 50d, and provides the inverted output signal to the voltage control line MGBN1.

In the write operation, the voltage VMGBPP of the power supply nodes N1a, N1c is set to 10 V, the voltage VMGBPN of the power supply nodes N2a, N2c is set to 4 V, the voltage VMGBNP of the power supply nodes N1b, N1d is set to the power supply voltage VDD (e.g., 1.5 V), and the voltage VMGBNN of the power supply nodes N2b, N2d is set to 0 V.

Moreover, the block selection PMOS side signal MGBSELP0 corresponding to the selected memory block (MB0 in this case) is set to an "H" level (power supply voltage VDD), the block selection PMOS side signal MGBSELP1 corresponding to the non-selected memory block (MB1 in this case) is set to an "L" level (0 V), and the block selection NMOS side signals MGBSELN0, MGBSELN1 are set to an "L" level (0 V). Thus, 4 V, the power supply voltage VDD, 10 V, and the power supply voltage VDD are output from the level shifters 50a-50d, respectively, and as shown also in FIG. 5, the voltage control lines MGBP0, MGBN0, MGBP1, and MGBN1 become 10 V, 0 V, 4 V, and 0 V, respectively.

In the erase operation, as shown in FIGS. 8A to 8D, the voltage VMGBPP of the power supply nodes N1a, N1c is set to the power supply voltage VDD, the voltage VMGBPN of the power supply nodes N2a, N2c is set to 0 V, the voltage VMGBNP of the power supply nodes N1b, N1d is set to the control voltage (−4 V in this case), and the voltage VMGBNN of the power supply nodes N2b, N2d is set to the erase voltage (−10 V in this case).

Moreover, the block selection NMOS side signal MGBSELN0 corresponding to a selected memory block (MB0 in this case) is set to an "L" level (0 V), the block selection NMOS side signal MGBSELN1 corresponding to a non-selected memory block (MB1 in this case) is set to an "H" level (power supply voltage VDD), and the block selection PMOS side signals MGBSELP0, MGBSELP1 are set to an "L" level (0 V). Thus, the power supply voltage VDD, −10 V, the power supply voltage VDD, and −10 V are output from the level shifters 50a-50d, respectively, and as shown also in FIG. 6, the voltage control lines MGBP0, MGBN0, MGBP1, and MGBN1 become 0 V, −10 V, 0 V, and −4 V, respectively.

FIGS. 9A to 9D are circuit block diagrams each showing a configuration of a portion related to the voltage control lines MGP0-MGP3 of the MGP/MGN decoders 42 shown in FIG. 5. In FIGS. 9A to 9D, the MGP/MGN decoder 42 includes level shifters 55a-55d, P-channel MOS transistors 56a-56d, N-channel MOS transistors 57a-57d, and power supply nodes N3a-N3d, N4a-N4d.

The level shifter 55a is driven by the voltages VMGPP, VMGPN provided from the power supply nodes N3a, N4a, and outputs the inverted signal of an MGP selection signal MGPSEL0. The source of the P-channel MOS transistor 56a is coupled to the power supply node N3a, the drain is coupled to the voltage control line MGP0, and the gate receives the output signal of the level shifter 55a. The drain of the N-channel MOS transistor 57a is coupled to the voltage control line MGP0, the source is coupled to the power supply node N4a, and the gate receives the output signal of the level shifter 55a. The transistors 56a, 57a constitute an inverter. This inverter is driven by the voltages VMGPP, VMGPN from the power supply nodes N3a, N4a, inverts the output signal of the level shifter 55a, and provides the inverted output signal to the voltage control line MGP0.

The level shifter 55b is driven by the voltages VMGPP, VMGPN provided from the power supply nodes N3b, N4b, and outputs the inverted signal of an MGP selection signal MGPSEL1. The source of the P-channel MOS transistor 56b is coupled to the power supply node N3b, the drain is coupled to the voltage control line MGP1, and the gate receives the output signal of the level shifter 55b. The drain of the N-channel MOS transistor 57b is coupled to the voltage control line MGP1, the source is coupled to the power supply node N4b, and the gate receives the output signal of the level shifter 55b. The transistors 56b, 57b constitute an inverter. This inverter is driven by the voltages VMGPP, VMGPN from the power supply nodes N3b, N4b, inverts the output signal of the level shifter 55b, and provides the inverted output signal to the voltage control line MGP1.

The level shifter 55c is driven by the voltages VMGPP, VMGPN provided from the power supply nodes N3c, N4c, and outputs the inverted signal of an MGP selection signal MGPSEL2. The source of the P-channel MOS transistor 56c is coupled to the power supply node N3c, the drain is coupled to the voltage control line MGP2, and the gate receives the output signal of the level shifter 55c. The drain of the N-channel MOS transistor 57c is coupled to the voltage control line MGP2, the source is coupled to the power supply node N4c, and the gate receives the output signal of the level shifter 55c. The transistors 56c, 57c constitute an inverter. This inverter is driven by the voltages VMGPP, VMGPN from the power supply nodes N3c, N4c, inverts the output signal of the level shifter 55c, and provides the inverted output signal to the voltage control line MGP2.

The level shifter 55d is driven by the voltages VMGPP, VMGPN provided from the power supply nodes N3d, N4d, and outputs the inverted signal of an MGP selection signal MGPSEL3. The source of the P-channel MOS transistor 56d is coupled to the power supply node N3d, the drain is coupled to the voltage control line MGP3, and the gate receives the output signal of the level shifter 55d. The drain of the N-channel MOS transistor 57d is coupled to the voltage control line MGP3, the source is coupled to the power supply node N4d, and the gate receives the output signal of the level shifter 55d. The transistors 56d, 57d constitute an inverter. This inverter is driven by the voltages VMGPP, VMGPN from the power supply nodes N3d, N4d, inverts the output signal of the level shifter 55d, and provides the inverted output signal to the voltage control line MGP3.

In the write operation, the voltage VMGPP of the power supply nodes N3a-N3d is set to 10 V, and the voltage VMGPN of the power supply nodes N4a-N4d is set to 4 V. Moreover, the MGP selection signal MGBSEL0 corresponding to a selected memory gate line (MG0 in this case) is set to an "L" level (0 V), and the MGP selection signals MGPSEL1-MGPSEL3 corresponding to the non-selected memory gate lines (MG1-MG3 in this case) are set to an "H" level (power supply voltage VDD). Thus, 10 V, 4 V, 4 V, and 4 V are output from the level shifters 55a-55d, respectively, and as shown also in FIG. 5, the voltage control lines MGP0-MGP3 become 4 V, 10 V, 10 V, and 10 V, respectively.

In the erase operation, as shown in FIGS. 10A to 10D, the voltage VMGPP of the power supply nodes N3a-N3d is set to 0 V, and the voltage VMGPN of the power supply nodes N4a-N4d is set to −4 V. Moreover, the MGP selection signal MGBSEL0 corresponding to a selected memory gate line (MG0 in this case) is set to an "H" level (power supply voltage VDD), and the MGP selection signals MGPSEL1-MGPSEL3 corresponding to the non-selected memory gate lines (MG1-MG3 in this case) are set to an "L" level (0 V). Thus, −4 V, 0 V, 0 V and 0 V are output from the level shifters 55a-55d, respectively, and as shown also in FIG. 6, the voltage control lines MGP0-MGP3 become 0 V, −4 V, −4 V, and −4 V, respectively.

FIGS. 11A to 11D are circuit block diagrams each showing a configuration of a portion related to the voltage control lines MGN0-MGN3 of the MGP/MGN decoder 42 shown in FIG. 5. In FIGS. 11A to 11D, the MGP/MGN decoder 42 includes level shifters 60a-60d, P-channel MOS transistors 61a-61d, N-channel MOS transistors 62a-62d, and power supply nodes N5a-N5d, N6a-N6d.

The level shifter 60a is driven by the voltages VMGNP, VMGNN provided from the power supply nodes N5a, N6a, and outputs the inverted signal of an MGN selection signal MGNSEL0. The source of the P-channel MOS transistor 61a is coupled to the power supply node N5a, the drain is coupled to the voltage control line MGN0, and the gate receives the output signal of the level shifter 60a. The drain of the N-channel MOS transistor 62a is coupled to the voltage control line MGN0, the source is coupled to the power supply node N6a, and the gate receives the output signal of the level shifter 60a. The transistors 61a, 62a constitute an inverter. This inverter is driven by the voltages VMGNP, VMGNN from the power supply nodes N5a, N6a, inverts the output signal of the level shifter 60a, and provides the inverted output signal to the voltage control line MGN0.

The level shifter 60b is driven by the voltages VMGNP, VMGNN provided from the power supply nodes N5b, N6b, and outputs the inverted signal of an MGN selection signal MGNSEL1. The source of the P-channel MOS transistor 61b is coupled to the power supply node N5b, the drain is coupled to the voltage control line MGN1, and the gate receives the output signal of the level shifter 60b. The drain of the N-channel MOS transistor 62b is coupled to the voltage control line MGN1, the source is coupled to the power supply node N6b, and the gate receives the output signal of the level shifter 60b. The transistors 61b, 62b constitute an inverter. This inverter is driven by the voltages VMGNP, VMGNN from the power supply nodes N5b, N6b, inverts the output signal of the level shifter 60b, and provides the inverted output signal to the voltage control line MGN1.

The level shifter 60c is driven by the voltages VMGNP, VMGNN provided from the power supply nodes N5c, N6c, and outputs the inverted signal of an MGN selection signal MGNSEL2. The source of the P-channel MOS transistor 61c is coupled to the power supply node N5c, the drain is coupled to the voltage control line MGN2, and the gate receives the output signal of the level shifter 60c. The drain of the N-channel MOS transistor 62c is coupled to the voltage control line MGN2, the source is coupled to the power supply node N6c, and the gate receives the output signal of the level shifter 60c. The transistors 61c, 62c constitute an inverter. This inverter is driven by the voltages VMGNP, VMGNN from the power supply nodes N5c, N6c, inverts the output signal of the level shifter 60c, and provides the inverted output signal to the voltage control line MGN2.

The level shifter 60d is driven by the voltages VMGNP, VMGNN provided from the power supply nodes N5d, N6d, and outputs the inverted signal of an MGN selection signal MGNSEL3. The source of the P-channel MOS transistor 61d is coupled to the power supply node N5d, the drain is coupled to the voltage control line MGN3, and the gate receives the output signal of the level shifter 60d. The drain of the N-channel MOS transistor 62d is coupled to the voltage control line MGN3, the source is coupled to the power supply node N6d, and the gate receives the output signal of the level shifter 60d. The transistors 61d, 62d constitute an inverter. This inverter is driven by the voltages VMGNP, VMGNN from the power supply nodes N5d, N6d, inverts the output signal of the level shifter 60d, and provides the inverted output signal to the voltage control line MGN3.

In the write operation, the voltage VMGNP of the power supply nodes N5a-N5d is set to 4 V, and the voltage VMGNN of the power supply nodes N6a-N6d is set to 0 V. Moreover, the MGN selection signal MGNSEL0 corresponding to a selected memory gate line (MG0 in this case) is set to an "L" level (0 V), and the MGN selection signals MGNSEL1-MGNSEL3 corresponding to the non-selected memory gates lines (MG1-MG3 in this case) are set to an "H" level (power supply voltage VDD). Thus, 4 V, 0 V, 0 V, and 0 V are output from the level shifters 60a-60d, respectively, and as shown also in FIG. 5, the voltage control lines MGN0-MGN3 become 0 V, 4 V, 4 V, and 4 V, respectively.

In the erase operation, as shown in FIGS. 12A to 12D, the voltage VMGNP of the power supply nodes N5a-N5d is set to -4 V, and the voltage VMGNN of the power supply nodes N6a-N6d is set to -10 V. Moreover, the MGN selection signal MGNSEL0 corresponding to a selected memory gate line (MG0 in this case) is set to an "H" level (power supply voltage VDD), and the MGN selection signals MGNSEL1-MGNSEL3 corresponding to the non-selected memory gate lines (MG1-MG3 in this case) are set to an "L" level (0 V). Thus, -10 V, -4 V, -4 V, and -4 V are output from the level shifters 60a-60d, respectively, and as shown also in FIG. 6, the voltage control lines MGN0-MGN3 become -4 V, -10 V, -10 V, and -10 V, respectively.

As described above, in this embodiment, in the write mode, the control voltage (4 V) between the positive write voltage (10 V) and the reference voltage (0 V) is applied to the gate of the P-channel MOS transistor 44 corresponding to the selected memory gate line MG0 to turn on the transistor 44, while the control voltage (4 V) is applied to the gate of the N-channel MOS transistor 46 corresponding to each of the non-selected memory gate lines MG1-MG3 to turn on the transistor 46.

In the erase operation, the control voltage (-4 V) between the reference voltage (0 V) and the negative erase voltage (-10 V) is applied to the gate of the N-channel MOS transistor 46 corresponding to the selected memory gate line MG0 to turn on the transistor 46, while the control voltage (-4 V) is applied to the gate of the P-channel MOS transistor 44 corresponding to each of the non-selected memory gate lines MG1-MG3 to turn on the transistor 44. Accordingly, the transistors 44, 46 are turned on with the gate-source voltage lower than the conventional one, and therefore deterioration in the transistors 44, 46 can be suppressed without increasing the layout area of the circuit. Moreover, deterioration in the transistors inside the decoders 40, 42 can be also suppressed. Hereinafter, effects of the present invention will be described in more detail using comparative examples.

Comparative Example

Figure 13:
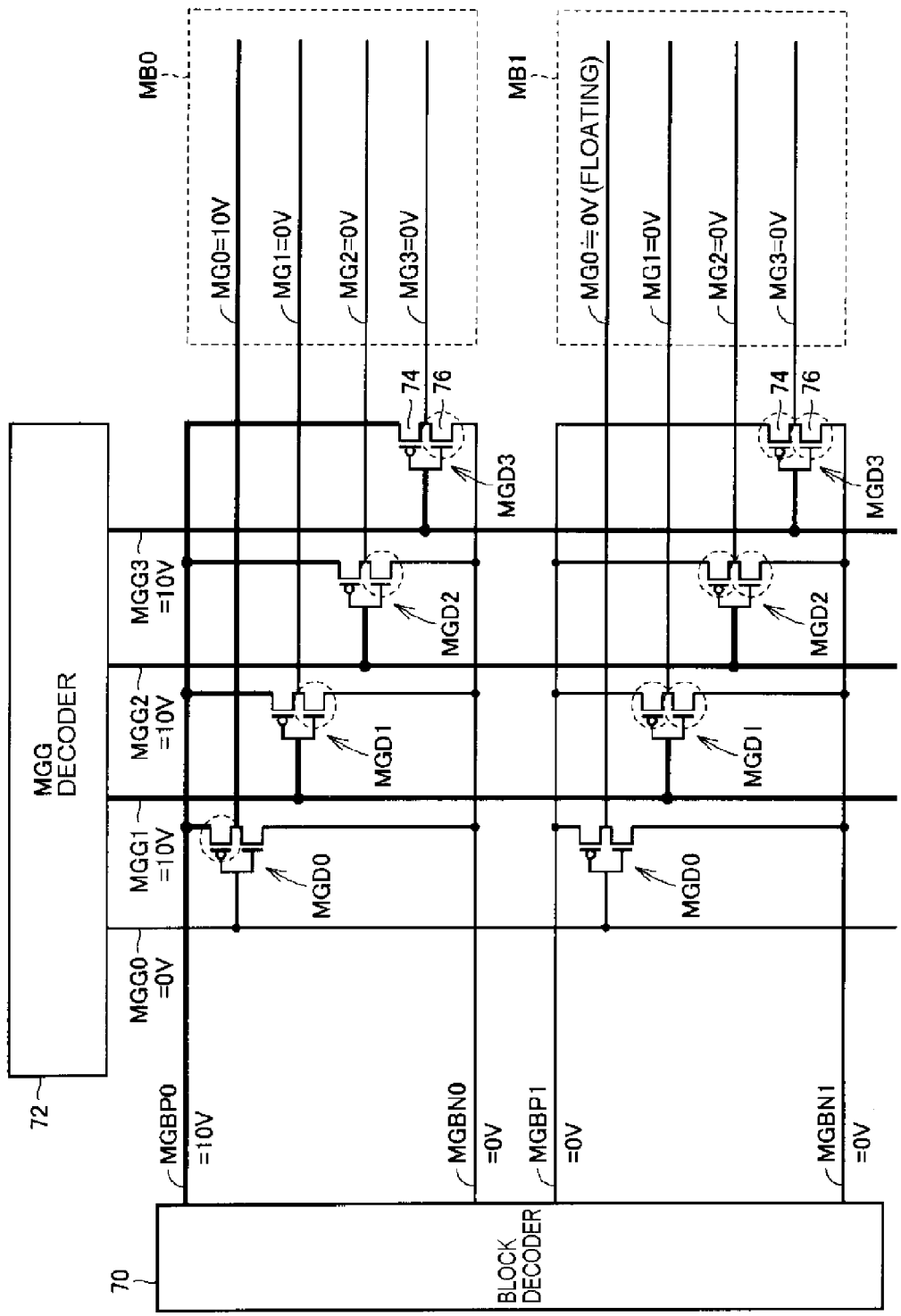
FIG. 13 is a circuit block diagram showing a configuration of an X decoder of a nonvolatile semiconductor memory device of a comparative example, and an operation in the write mode.

FIG. 13 is a circuit block diagram showing a configuration of a portion involved in driving the memory gate line MG of the X decoder of a nonvolatile semiconductor device of a comparative example, and is the diagram to be compared with FIG. 5. In FIG. 13, two memory blocks MB0, MB1 of the memory blocks MB are representatively shown. Moreover, four memory gate lines MG0-MG3 of the memory gate lines MG of each memory block MB are representatively shown.

The X decoder includes: a block decoder 70; the voltage control lines MGBP0 and MGBP1 respectively provided corresponding to the memory blocks MB0 and MB1; and the voltage control lines MGBN0 and MGBN1 respectively provided corresponding to the memory blocks MB0 and MB1. The voltage control lines MGBP0, MGBP1, MGBN0, and MGBN1 extend in the same direction as that of the memory gate line MG. The block decoder 70 sets each voltage of the voltage control lines MGBP0, MGBP1, MGBN0, and MGBN1.

Moreover, the X decoder includes an MGG decoder 72 and four voltage control lines MGG0-MGG3. The voltage control lines MGG0-MGG3 respectively are provided commonly to two memory blocks MB0, MB1 corresponding to the memory gate lines MG0-MG3. The voltage control lines MGG0-MGG3 cross the voltage control lines MGBP0, MGBP1, MGBN0, and MGBN1. The MGG decoder 72 sets each voltage of the voltage control lines MGG0-MGG3.

Moreover, the X decoder includes the memory gate drive circuits MGD0-MGD3 respectively corresponding to the memory gate lines MG0-MG3 of the memory block MB0, and the memory gate drive circuits MGD0-MGD3 respectively corresponding to the memory gate lines MG0-MG3 of the memory block MB1. Each memory gate drive circuit MGD includes a P-channel MOS transistor 74 and an N-channel MOS transistor 76.

The source of the P-channel MOS transistor 74 is coupled to the corresponding voltage control line MGBP, the drain is coupled to the corresponding memory gate line MG, and the gate is coupled to the corresponding voltage control line MGG. The source of the N-channel MOS transistor 76 is coupled to the corresponding voltage control line MGBN, the drain is coupled to the corresponding memory gate line MG, and the gate is coupled to the corresponding voltage control line MGG.

Next, the operation of the decoders 70, 72 in the write mode is described. Here, assume that the memory gate line MG0 of the memory block MB0 has been selected. The block decoder 70 applies a positive write voltage (e.g., 10 V) to the voltage control line MGBP0 corresponding to the selected memory block MB0 and also applies a reference voltage (e.g., 0 V) to the voltage control line MGBN0 corresponding to the memory block MB0. Moreover, the block decoder 40 applies a reference voltage (e.g., 0 V) to the voltage control lines MGBP1, MGBN1 corresponding to the non-selected memory block MB1.

In the write mode, the MGG decoder 72 applies the above-described reference voltage (0 V in this case) to the voltage control line MGG0 corresponding to the selected memory gate line MG0. Moreover, the MGG decoder 72 applies the above-described write voltage (10 V in this case) to each of the voltage control lines MGG1-MGG3 corresponding to the non-selected memory gate lines MG1-MG3.

In the memory gate drive circuit MGD0 corresponding to the selected memory gate line MG0 of the selected memory block MB0, the P-channel MOS transistor 74 is turned on and the N-channel MOS transistor 76 is turned off, and the write voltage (10 V in this case) is applied to the memory gate line MG0. Thus, data write is performed on the memory cell MC of a selected column of the memory cells MC corresponding to the memory gate line MG0.

Moreover, in the memory gate drive circuits MGD1-MGD3 corresponding to the non-selected memory gate lines MG1-MG3 of the selected memory block MB0, the P-channel MOS transistor 74 is turned off and the N-channel MOS transistor 76 is turned on, and the reference voltage (0 V in this case) is applied to each of the memory gate lines MG1-MG3. Thus, data rewrite is not performed in each memory cell MC corresponding to the memory gate lines MG1-MG3.

Moreover, in the memory gate drive circuits MGD1-MGD3 corresponding to the non-selected memory gate lines MG1-MG3 of the non-selected memory block MB1, the transistors 74, 76 are turned on and the reference voltage (0 V in this case) is applied to each of the memory gate lines MG1-MG3. Thus, data rewrite is not performed in each memory cell MC corresponding to the memory gate lines MG1-MG3.

Moreover, in the memory gate drive circuit MGD0 corresponding to the selected memory gate line MG0 of the non-selected memory block MB1, both the P-channel MOS transistor 44 and the N-channel MOS transistor 46 are turned off, and the memory gate line MG0 is set to a floating state. In the standby state, each memory gate line MG is kept at the reference voltage (0 V in this case), and therefore, even if both the P-channel MOS transistor 44 and the N-channel MOS transistor 46 are turned off, the memory gate line MG0 is kept approximately at the reference voltage (0 V in this case). Thus, data rewrite is not performed in each memory cell MC corresponding to the memory gate line MG0.

As described above, in the write mode, since the transistors 74, 76 surrounded by a dotted line in FIG. 13 are turned on by applying a high voltage (10 V) to between the gate-source of each of the transistors 74, 76, the transistors 74, 76 will quickly deteriorate. In contrast, in the present invention, as shown in FIG. 5, since the transistors 44, 46 are turned on by applying a relatively low voltage (4 V or 6V) to between the gate-source of each of the transistors 44, 46, the transistors 44, 46 will deteriorate more slowly than those of the comparative example.

Figure 14:
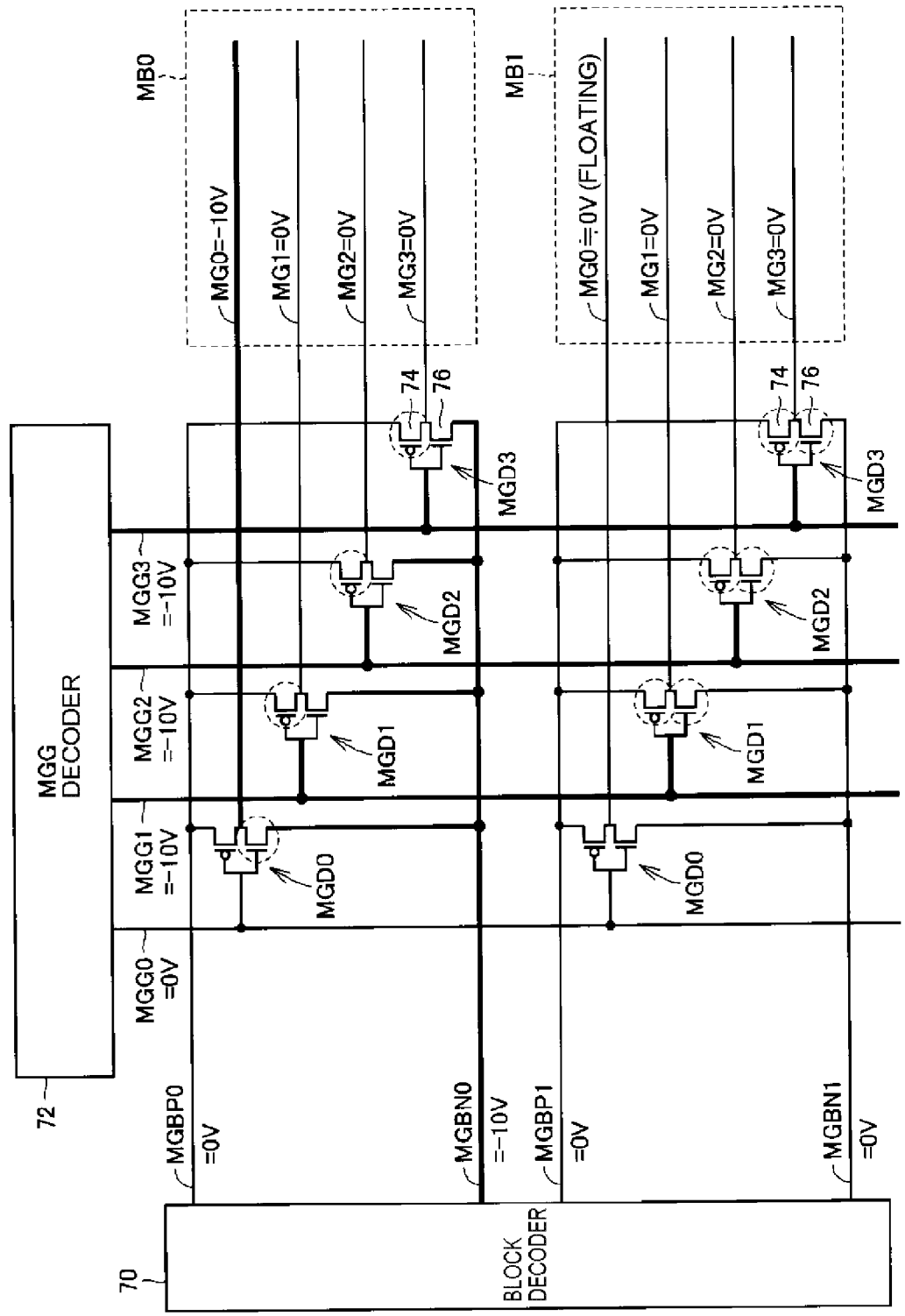
FIG. 14 is a circuit block diagram showing an operation in the erase mode of the X decoder shown in FIG. 13.
Figure 15:
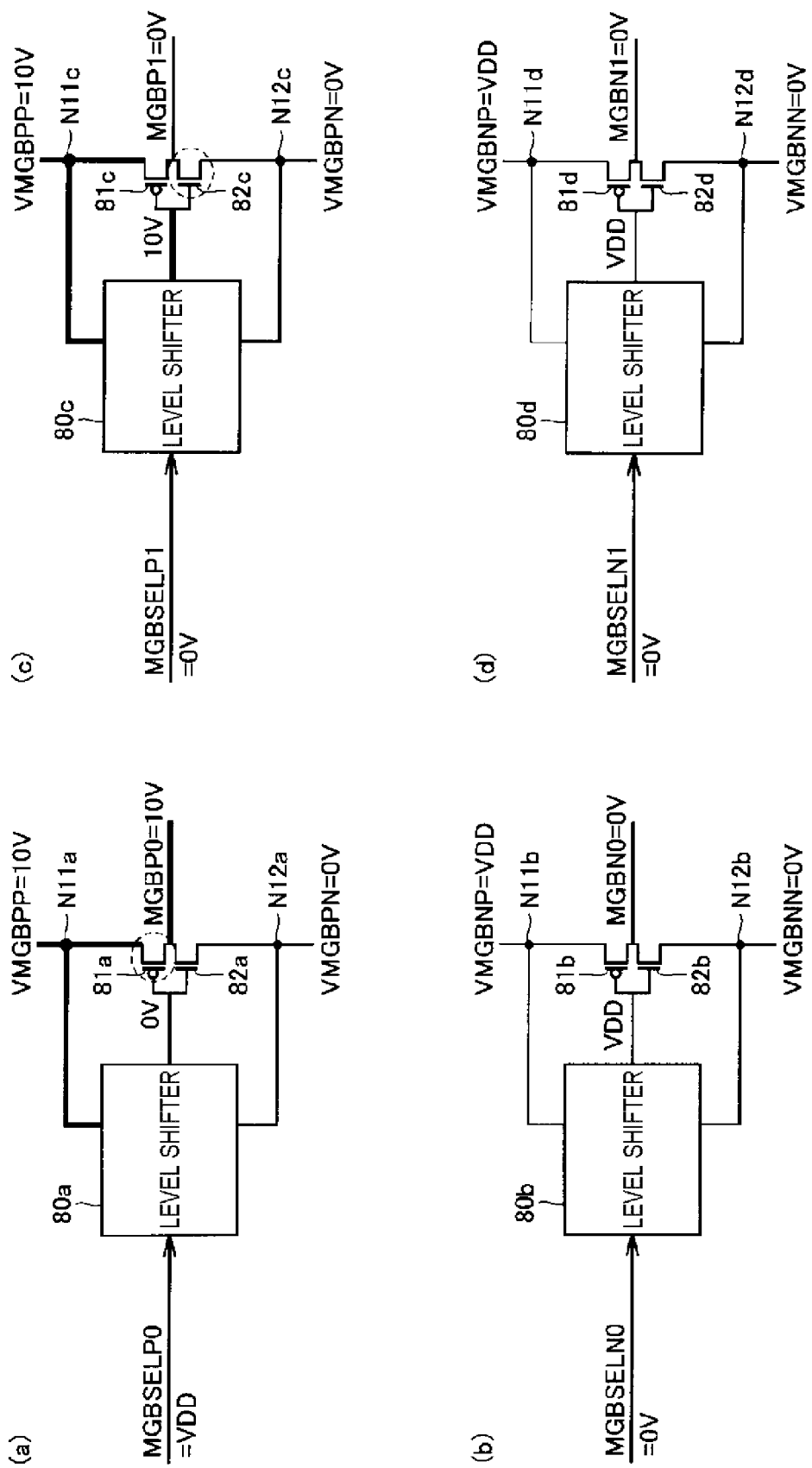
FIGS. 15A to 15D are circuit block diagrams each showing a configuration of the block decoder shown in FIG. 13, and an operation in the write mode.
Figure 16:
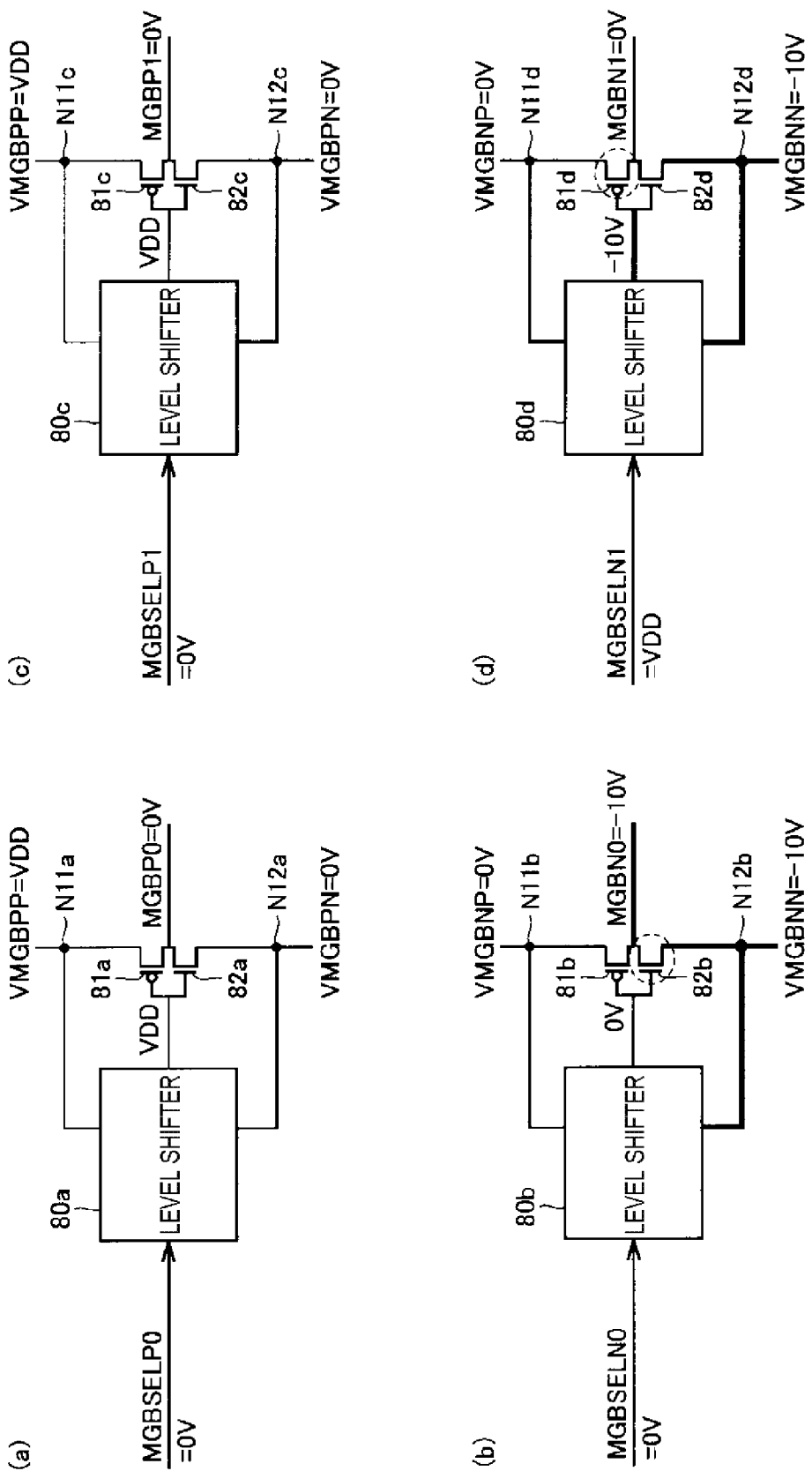
FIGS. 16A to 16D are circuit block diagrams each showing an operation in the erase mode of the block decoder shown in FIGS. 15A to 15D.
Figure 17:
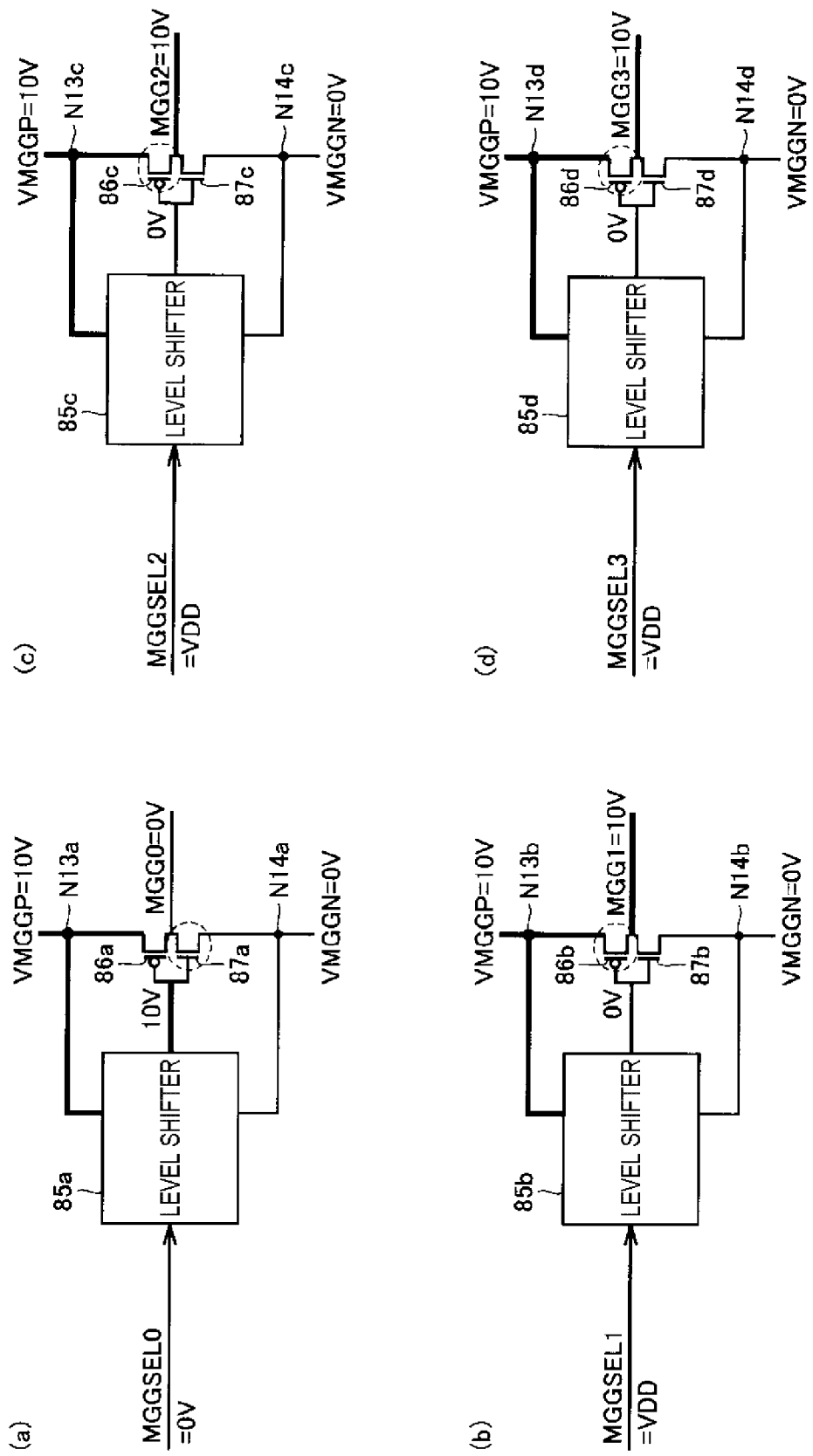
FIGS. 17A to 17D are circuit block diagrams each showing a configuration of the MGG decoder shown in FIG. 14, and an operation in the write mode.
Figure 18:
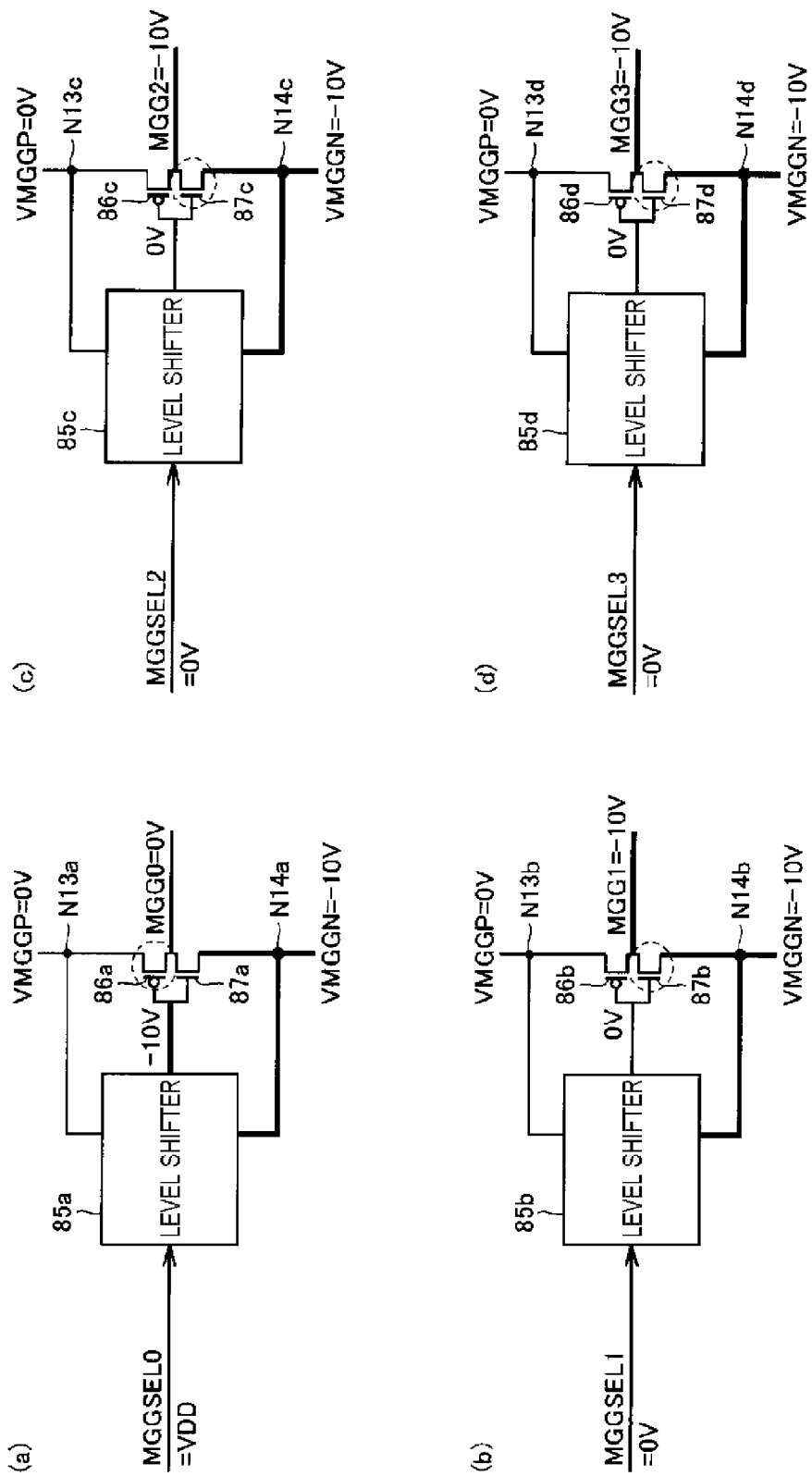
FIGS. 18A to 18D are circuit block diagrams each showing an operation in the erase mode of the MGG decoder shown in FIGS. 17A to 17D.

FIG. 14 is a circuit block diagram showing an operation of the decoders 70, 72 in the erase mode, and is the diagram to be compared with FIG. 6. Here, assume that the memory gate line MG0 of the memory block MB0 has been selected. The block decoder 70 applies a negative erase voltage (e.g., −10 V) to the voltage control line MGBN0 corresponding to the selected memory block MB0 and also applies a reference voltage (e.g., 0 V) to the voltage control line MGBP0 corresponding to the memory block MB0. Moreover, the block decoder 70 applies a reference voltage (e.g., 0 V) to the voltage control lines MGBN1, MGBP1 corresponding to the non-selected memory block MB1.

The MGG decoder 72 applies the above-described reference voltage (0 V in this case) to the voltage control line MGG0 corresponding to the selected memory gate line MG0 and also applies the above-described erase voltage (−10 V in this case) to each of the voltage control lines MGP1-MGP3 corresponding to the non-selected memory gate lines MG1-MG3.

In the memory gate drive circuit MGD0 corresponding to the selected memory gate line MG0 of the selected memory block MB0, the P-channel MOS transistor 74 is turned off and the N-channel MOS transistor 76 is turned on, and the erase voltage (−10 V in this case) is applied to the memory gate line MG0. Thus, the data erase of the memory cell MC of a selected column of the memory cells MC corresponding to the memory gate line MG0 is performed.

Moreover, in the memory gate drive circuits MGD1-MGD3 corresponding to the non-selected memory gate lines MG1-MG3 of the selected memory block MB0, the P-channel MOS transistor 74 is turned on and the N-channel MOS transistor 76 is turned off, and the reference voltage (0 V in this case) is applied to each of the memory gate lines MG1-MG3. Thus, data rewrite is not performed in each memory cell MC corresponding to the memory gate lines MG1-MG3.

In the memory gate drive circuits MGD1-MGD3 corresponding to the non-selected memory gate lines MG1-MG3 of the non-selected memory block MB1, both the P-channel MOS transistor 74 and the N-channel MOS transistor 76 are turned on, and the reference voltage (0 V in this case) is applied to each of the memory gate lines MG1-MG3. Thus, data rewrite is not performed in each memory cell MC corresponding to the memory gate lines MG1-MG3.

Moreover, in the memory gate drive circuit MGD0 corresponding to the selected memory gate line MG0 of the non-selected memory block MB1, both the P-channel MOS transistor 74 and the N-channel MOS transistor 76 are turned off, and the memory gate line MG0 is set to a floating state. In the standby state, since each memory gate line MG is kept at the reference voltage (0 V in this case), even if both the P-channel MOS transistor 74 and the N-channel MOS transistor 76 are turned off, the memory gate line MG0 is kept approximately at the reference voltage (0 V in this case). Thus, data rewrite is not performed in each memory cell MC corresponding to the memory gate line MG0.

As described above, in the erase mode, since the transistors 74, 76 surrounded by a dotted line in FIG. 14 are turned on by applying a high voltage (10 V) to between the gate-source of each of the transistors 74, 76, the transistors 74, 76 will quickly deteriorate. In contrast, in the present invention, as shown in FIG. 6, since the transistors 44, 46 are turned on by applying a relatively low voltage (4 V or 6 V) to between the gate-source of each of the transistors 44, 46, the transistors 44, 46 will deteriorate more slowly than those of the comparative example.

FIGS. 15A to 15D are circuit block diagrams each showing a configuration of the block decoder 70 shown in FIG. 13, and are diagrams to be compared with FIGS. 7A to 7D. In FIGS. 15A to 15D, the block decoder 70 includes level shifters 80a-80d, P-channel MOS transistors 81a-81d, N-channel MOS transistors 82a-82d, and power supply nodes N11a-N11d, N12a-N12d.

The level shifter 80a is driven by the voltages VMGBPP, VMGBPN provided from the power supply nodes N11a, N12a, and outputs the inverted signal of a block selection PMOS side signal MGBSELP0. The source of the P-channel MOS transistor 81a is coupled to the power supply node N11*a*, the drain is coupled to the voltage control line MGBP0, and the gate receives the output signal of the level shifter 80*a*. The drain of the N-channel MOS transistor 82*a* is coupled to the voltage control line MGBP0, the source is coupled to the power supply node N12*a*, and the gate receives the output signal of the level shifter 80*a*. The transistors 81*a*, 82*a* constitute an inverter. This inverter is driven by the voltages VMGBPP, VMGBPN from the power supply nodes N11*a*, N12*a*, inverts the output signal of the level shifter 80*a*, and provides the inverted output signal to the voltage control line MGBP0.

The level shifter 80*b* is driven by the voltages VMGBNP, VMGBNN provided from the power supply nodes N11*b*, N12*b*, and outputs the inverted signal of the block selection NMOS side signal MGBSELN0. The source of the P-channel MOS transistor 81*b* is coupled to the power supply node N11*b*, the drain is coupled to the voltage control line MGBN0, and the gate receives the output signal of the level shifter 80*b*. The drain of the N-channel MOS transistor 82*b* is coupled to the voltage control line MGBN0, the source is coupled to the power supply node N12*b*, and the gate receives the output signal of the level shifter 80*b*. The transistors 81*b*, 82*b* constitute an inverter. This inverter is driven by the voltages VMGBNP, VMGBNN from the power supply nodes N11*b*, N12*b*, inverts the output signal of the level shifter 80*b*, and provides the inverted output signal to the voltage control line MGBN0.

The level shifter 80*c* is driven by the voltages VMGBPP, VMGBPN provided from the power supply nodes N11*c*, N12*c*, and outputs the inverted signal of the block selection PMOS side signal MGBSELP1. The source of the P-channel MOS transistor 81*c* is coupled to the power supply node N11*c*, the drain is coupled to the voltage control line MGBP1, and the gate receives the output signal of the level shifter 80*c*. The drain of the N-channel MOS transistor 82*c* is coupled to the voltage control line MGBP1, the source is coupled to the power supply node N12*c*, and the gate receives the output signal of the level shifter 80*c*. The transistors 81*c*, 82*c* constitute an inverter. This inverter is driven by the voltages VMGBPP, VMGBPN from the power supply nodes N11*c*, N12*c*, inverts the output signal of the level shifter 80*c*, and provides the inverted output signal to the voltage control line MGBP1.

The level shifter 80*d* is driven by the voltages VMGBNP, VMGBNN provided from the power supply nodes N11*d*, N12*d*, and outputs the inverted signal of the block selection NMOS side signal MGBSELN1. The source of the P-channel MOS transistor 81*d* is coupled to the power supply node N11*d*, the drain is coupled to the voltage control line MGBN1, and the gate receives the output signal of the level shifter 80*d*. The drain of the N-channel MOS transistor 82*d* is coupled to the voltage control line MGBN1, the source is coupled to the power supply node N12*d*, and the gate receives the output signal of the level shifter 80*d*. The transistors 81*d*, 82*d* constitute an inverter. This inverter is driven by the voltages VMGBNP, VMGBNN from the power supply nodes N11*d*, N12*d*, inverts the output signal of the level shifter 80*d*, and provides the inverted output signal to the voltage control line MGBN1.

In the write operation, the voltage VMGBPP of the power supply nodes N11*a*, N11*c* is set to 10 V, the voltage VMGBPN of the power supply nodes N12*a*, N12*c* is set to 0 V, the voltage VMGBNP of the power supply nodes N1*b*, N1*d* is set to the power supply voltage VDD (e.g., 1.5 V), and the voltage VMGBNN of the power supply nodes N2*b*, N2*d* is set to 0 V.

Moreover, the block selection PMOS side signal MGBSELP0 corresponding to the selected memory block (MB0 in this case) is set to an "H" level (power supply voltage VDD), the block selection PMOS side signal MGBSELP1 corresponding to the non-selected memory block (MB1 in this case) is set to an "L" level (0 V), and the block selection NMOS side signals MGBSELN0, MGBSELN1 are set to an "L" level (0 V). Thus, 0 V, the power supply voltage VDD, 10 V, and the power supply voltage VDD are output from the level shifters 80*a*-80*d*, respectively, and as shown also in FIG. 13, the voltage control lines MGBP0, MGBN0, MGBP1, and MGBN1 become 10 V, 0 V, 0 V, and 0 V, respectively.

As described above, in the write mode, since the transistors 81*a*, 82*c* surrounded by a dotted line in FIGS. 15A to 15D are turned on by applying a high voltage (10 V) to between the gate-source of each of the transistors 81*a*, 82*c*, the transistors 81*a*, 82*c* will quickly deteriorate. In contrast, in the present invention, as shown in FIGS. 7A to 7D, since the transistors 51*a*, 52*c* are turned on by applying a relatively low voltage (6V) to between the gate-source of the transistors 51*a*, 52*c*, the transistors 51*a*, 52*c* will deteriorate more slowly than those of the comparative example.

In the erase operation, as shown in FIGS. 16A to 16D, the voltage VMGBPP of the power supply nodes N11*a*, N11*c* is set to the power supply voltage VDD, the voltage VMGBPN of the power supply nodes N12*a*, N12*c* is set to 0 V, the voltage VMGBNP of the power supply nodes N11*b*, N11*d* is set to the reference voltage (0 V in this case), and the voltage VMGBNN of the power supply nodes N12*b*, N12*d* is set to the erase voltage (-10 V in this case).

Moreover, the block selection NMOS side signal MGBSELN0 corresponding to a selected memory block (MB0 in this case) is set to an "L" level (0 V), the block selection NMOS side signal MGBSELN1 corresponding to a non-selected memory block (MB1 in this case) is set to an "H" level (power supply voltage VDD), and the block selection PMOS side signals MGBSELP0, MGBSELP1 are set to an "L" level (0 V). Thus, the power supply voltage VDD, 0 V, the power supply voltage VDD, and -10 V are output from the level shifters 80*a*-80*d*, respectively, and as shown also in FIG. 14, the voltage control lines MGBP0, MGBN0, MGBP1, and MGBN1 become 0 V, -10 V, 0 V and 0 V, respectively.

As described above, in the erase operation, since the transistors 82*b*, 81*d* surrounded by a dotted line in FIGS. 16A to 16D are turned on by applying a high voltage (10 V) to between the gate-source of each of the transistors 82*b*, 81*d*, the transistors 82*b*, 81*d* will quickly deteriorate. In contrast, in the present invention, as shown in FIGS. 7A to 7D, since the transistors 52*b*, 51*d* are turned on by applying a relatively low voltage (6 V) to between the gate-source of the transistors 52*b*, 51*d*, the transistors 52*b*, 51*d* will deteriorate more slowly than those of the comparative example.

FIGS. 17A to 17D are circuit block diagrams each showing a configuration of the MGG decoder 72 shown in FIG. 13. In FIGS. 17A to 17D, the MGG decoder 72 includes level shifters 85*a*-85*d*, P-channel MOS transistors 86*a*-86*d*, N-channel MOS transistors 87*a*-87*d*, and power supply nodes N13*a*-N13*d*, N14*a*-N14*d*.

The level shifter 85*a* is driven by voltages VMGGP, VMGGN provided from the power supply nodes N13*a*, N14*a*, and outputs the inverted signal of an MGG selection signal MGGSEL0. The source of the P-channel MOS transistor 86*a* is coupled to the power supply node N13*a*, the drain is coupled to the voltage control line MGG0, and the gate receives the output signal of the level shifter 85*a*. The drain of the N-channel MOS transistor 87*a* is coupled to the voltage control line MGG0, the source is coupled to the power supply node N14*a*, and the gate receives the output signal of the level shifter 85*a*. The transistors 86*a*, 87*a* constitute an inverter.

This inverter is driven by the voltages VMGGP, VMGGN from the power supply nodes N13a, N14a, inverts the output signal of the level shifter 85a, and provides the inverted output signal to the voltage control line MGG0.

The level shifter 85b is driven by the voltages VMGGP, VMGGN provided from the power supply nodes N13b, N14b, and outputs the inverted signal of an MGG selection signal MGGPSEL1. The source of the P-channel MOS transistor 86b is coupled to the power supply node N13b, the drain is coupled to the voltage control line MGG1, and the gate receives the output signal of the level shifter 85b. The drain of the N-channel MOS transistor 87b is coupled to the voltage control line MGG1, the source is coupled to the power supply node N14b, and the gate receives the output signal of the level shifter 85b. The transistors 86b, 87b constitute an inverter. This inverter is driven by the voltages VMGGP, VMGGN from the power supply nodes N13b, N14b, inverts the output signal of the level shifter 85b, and provides the inverted output signal to the voltage control line MGG1.

The level shifter 85c is driven by the voltages VMGGP, VMGGN provided from the power supply nodes N13c, N14c, and outputs the inverted signal of an MGG selection signal MGGSEL2. The source of the P-channel MOS transistor 86c is coupled to the power supply node N13c, the drain is coupled to the voltage control line MGG2, and the gate receives the output signal of the level shifter 85c. The drain of the N-channel MOS transistor 87c is coupled to the voltage control line MGG2, the source is coupled to the power supply node N14c, and the gate receives the output signal of the level shifter 85c. The transistors 86c, 87c constitute an inverter. This inverter is driven by the voltages VMGGP, VMGGN from the power supply nodes N13c, N14c, inverts the output signal of the level shifter 85c, and provides the inverted output signal to the voltage control line MGG2.

The level shifter 85d is driven by the voltages VMGGP, VMGGN provided from the power supply nodes N13d, N14d, and outputs the inverted signal of an MGG selection signal MGGSEL3. The source of the P-channel MOS transistor 86d is coupled to the power supply node N13d, the drain is coupled to the voltage control line MGG3, and the gate receives the output signal of the level shifter 85d. The drain of the N-channel MOS transistor 87d is coupled to the voltage control line MGG3, the source is coupled to the power supply node N14d, and the gate receives the output signal of the level shifter 85d. The transistors 86d, 87d constitute an inverter. This inverter is driven by the voltages VMGGP, VMGGN from the power supply nodes N13d, N14d, inverts the output signal of the level shifter 85d, and provides the inverted output signal to the voltage control line MGG3.

In the write operation, the voltage VMGGP of the power supply nodes N13a-N13d is set to 10 V, and the voltage VMGGN of the power supply nodes N14a-N14d is set to 0 V. Moreover, the MGG selection signal MGGSEL0 corresponding to a selected memory gate line (MG0 in this case) is set to an "L" level (0 V), while the MGG selection signals MGGSEL1-MGGSEL3 corresponding to the non-selected memory gate lines (MG1-MG3 in this case) are set to an "H" level (power supply voltage VDD). Thus, 10 V, 0 V, 0 V, and 0 V are output from the level shifters 85a-85d, respectively, and as shown also in FIG. 13, the voltage control lines MGP0-MGP3 become 0 V, 10 V, 10 V, and 10 V, respectively.

As describe above, in the write mode, since the transistors 87a, 86b-86d surrounded by a dotted line in FIGS. 17A to 17D are turned on by applying a high voltage (10 V) to between the gate-source of each of the transistors 87a, 86b-86d, the transistors 87a, 86b-86d will quickly deteriorate. In contrast, in the present invention, as shown in FIGS. 9A to 9D, since the transistors 57a, 56b-56d are turned on by applying a relatively low voltage (6 V) to between the gate-source of each of the transistors 57a, 56b-56d, the transistors 57a, 56b-56d will deteriorate more slowly than those of the comparative example.

In the erase operation, as shown in FIGS. 18A to 18D, the voltage VMGGP of the power supply nodes N13a-N13d is set to 0 V, and the voltage VMGGN of the power supply nodes N14a-N14d is set to −10 V. Moreover, the MGG selection signal MGGSEL0 corresponding to a selected memory gate line (MG0 in this case) is set to an "H" level (power supply voltage VDD), while the MGG selection signals MGGSEL1-MGGSEL3 corresponding to the non-selected memory gate lines (MG1-MG3 in this case) are set to an "L" level (0 V). Thus, −10 V, 0 V, 0 V and 0 V are output from the level shifters 85a-85d, respectively, and as shown also in FIG. 16, the voltage control lines MGP0-MGP3 become 0 V, −10 V, −10 V, and −10 V, respectively.

As describe above, in the erase operation, since the transistors 86a, 87b-87d surrounded by a dotted line in FIGS. 18A to 18D are turned on by applying a high voltage (10 V) to between the gate-source of each of the transistors 86a, 87b-87d, the transistors 86a, 87b-87d will quickly deteriorate. In contrast, in the present invention, as shown in FIGS. 10A to 10D, since the transistors 56a, 57b-57d are turned on by applying a relatively low voltage (4 V) to between the gate-source of each of the transistors 56a, 57b-57d, the transistors 56a, 57b-57d will deteriorate more slowly than those of the comparative example.

Modification Example

Figure 19:
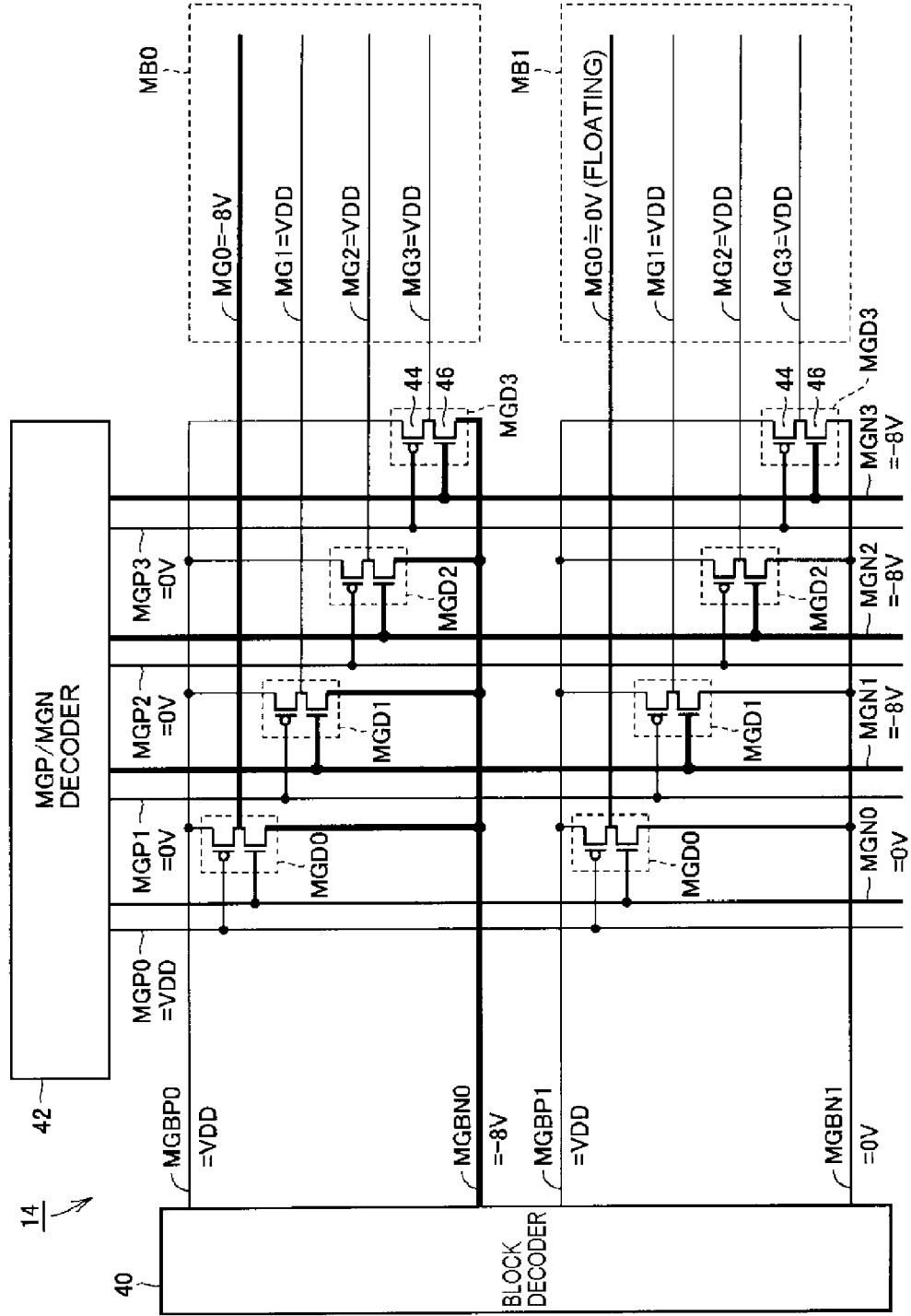
FIG. 19 is a circuit block diagram showing a modification example of the embodiment.

FIG. 19 is a circuit block diagram showing a modification example of the embodiment, and is the diagram to be compared with FIG. 5. In FIG. 19, in this modification example, the power supply voltage VDD is used as the reference voltage, −8 V is used as the negative erase voltage, and 0 V is used as the control voltage between the reference voltage and the erase voltage. In this modification example, the same effect as that of the embodiment is obtained, and in addition, a charge pumping circuit for generating −4 V is not required.

All the embodiments disclosed here should be considered to be illustrative only in every respect but not restrictive. The scope of the present invention is indicated not by the above-mentioned descriptions but by the appended claims. The scope of the present invention is intended to include the meaning equivalent to the appended claims and all the modification within the scope of the inventions.

What is claimed is:

1. A semiconductor device, comprising:
   a plurality of memory transistors each storing data by a change in a level of a threshold voltage;
   a P-type transistor provided corresponding to each of the memory transistors, and having a source receiving a first voltage and a drain coupled to a gate of the corresponding memory transistor;
   an N-type transistor provided corresponding to each of the memory transistors, and having a drain coupled to the gate of the corresponding memory transistor and a source receiving a second voltage, which is lower than the first voltage; and
   a voltage control circuit rewriting data of a selected memory transistor of the memory transistors by applying a third voltage, which is a voltage between the first voltage and the second voltage, to the gate of one of the P-type transistor and the N-type transistor corresponding to each of the memory transistors and further applying the first or second voltage to the gate of the other transistor, wherein:

the voltage control circuit, in rewriting data of the selected memory transistor, applies the first voltage to the gate of the P-type transistor corresponding to the selected memory transistor to turn off this P-type transistor, and applies the third voltage to the gate of the N-type transistor corresponding to the selected memory transistor to turn on this N-type transistor; and applies the third voltage to the gate of the P-type transistor corresponding to a non-selected memory transistor other than the selected memory transistor to turn on this P-type transistor, and applies the second voltage to the gate of the N-type transistor corresponding to the non-selected memory transistor to turn off this N-type transistor.

2. A semiconductor device, comprising:

a plurality of memory transistors each storing data by a change in a level of a threshold voltage;

a first and a second voltage control lines commonly provided to the memory transistors;

a P-type transistor provided corresponding to each of the memory transistors and coupled between the first voltage control line and a gate of the corresponding memory transistor;

an N-type transistor provided corresponding to each of the memory transistors and coupled between the gate of the corresponding memory transistor and the second voltage control line; and a voltage control circuit rewriting data of a selected memory transistor of the memory transistors by independently controlling the respective voltages of the first voltage control line, the second voltage control line, the gate of the P-type transistor, and the gate of the N-type transistor, applying a voltage, which is a voltage between the voltage of the first voltage control line and the voltage of the second voltage control line, to a gate of one of the P-type transistor and the N-type transistor corresponding to each of the memory transistors, and applying a voltage of the first or second voltage control line to a gate of the other transistor, wherein:

the voltage control circuit, in rewriting data of the selected memory transistor, applies a reference voltage to the first voltage control line and also applies a negative voltage to the second voltage control line;

applies the reference voltage to the gate of the P-type transistor corresponding to the selected memory transistor to turn off this P-type transistor, and applies a control voltage, which is a voltage between the reference voltage and the negative voltage, to the gate of the N-type transistor corresponding to the selected memory transistor to turn on this N-type transistor; and applies the control voltage to the gate of the P-type transistor corresponding to a non-selected memory transistor other than the selected memory transistor to turn on this P-type transistor, and applies the negative voltage to the gate of the N-type transistor corresponding to the non-selected memory transistor to turn off this N-type transistor.

3. A semiconductor device comprising a plurality of memory blocks each including a first to an M-th (where, M is an integer of 2 or greater) memory transistors, each of the first to M-th memory transistors storing data by a change in a level of a threshold voltage, and the semiconductor device further comprising:

a first and a second voltage control lines provided corresponding to each of the memory blocks;

a first to an M-th P-type transistors provided corresponding to the first to M-th memory transistors of each of the memory blocks, and coupled between the corresponding first voltage control line and the gates of the corresponding first to M-th memory transistors, respectively;

a first to an M-th N-type transistors provided corresponding to the first to M-th memory transistors of each of the memory blocks, and coupled between the second voltage control line and the gates of the corresponding first to M-th memory transistors, respectively;

a first to an M-th sub-voltage control lines commonly provided to the memory blocks, and coupled to the gates of the first to M-th P-type transistors of each of the memory blocks, respectively;

an (M+1)th to a (2×M)th sub-voltage control lines commonly provided to the memory blocks and coupled to the gates of the first to M-th N-type transistors of each of the memory blocks, respectively; and a voltage control circuit rewriting data of a selected memory transistor of the memory transistors belonging to the selected memory block by independently controlling the respective voltages of the first voltage control line, the second voltage control line, and the first to (2×M)th sub-voltage control lines, applying a voltage, which is a voltage between a voltage of the first voltage control line and a voltage of the second voltage control line, to the gate of one of the P-type transistor and the N-type transistor corresponding to each of the memory transistors, and applying a voltage of the first or second voltage control line corresponding to a selected memory block of the memory blocks to a gate of the other transistor, wherein:

the voltage control circuit, in rewriting data of the selected memory transistor, applies a positive voltage to a first voltage control line corresponding to the selected memory block and also applies a reference voltage to a second voltage control line corresponding to the selected memory block;

applies a control voltage, which is a voltage between the positive voltage and the reference voltage, to a first voltage control line corresponding to a non-selected memory block other than the selected memory block and also applies the reference voltage to a second voltage control line corresponding to the non-selected memory block;

applies the control voltage to the sub-voltage control line corresponding to the selected memory transistor of the first to M-th sub-voltage control lines to turn on the P-type transistor corresponding to the selected memory transistor of the first to M-th P-type transistors, and applies the reference voltage to the sub-voltage control line corresponding to the selected memory transistor of the (M+1)th to (2×M)th sub-voltage control lines to turn off the N-type transistor corresponding to the selected memory transistor of the first to M-th N-type transistors; and applies the positive voltage to the sub-voltage control line corresponding to the non-selected memory transistor of the first to M-th sub-voltage control lines to turn off the P-type transistor corresponding to the non-selected memory transistor of the first to M-th P-type transistors, and applies the control voltage to the sub-voltage control line corresponding to the non-selected memory transistor of the (M+1)th to (2×M)th sub-voltage control lines to turn on the N-type transistor corresponding to the non-selected memory transistor of the first to M-th N-type transistors.

4. A semiconductor device comprising a plurality of memory blocks each including a first to an M-th (where, M is an integer of 2 or greater) memory transistors,
each of the first to M-th memory transistors storing data by a change in a level of a threshold voltage, and
the semiconductor device further comprising:
a first and a second voltage control lines provided corresponding to each of the memory blocks;
a first to an M-th P-type transistors provided corresponding to the first to M-th memory transistors of each of the memory blocks, and coupled between the corresponding first voltage control line and the gates of the corresponding first to M-th memory transistors, respectively;
a first to an M-th N-type transistors provided corresponding to the first to M-th memory transistors of each of the memory blocks, and coupled between the second voltage control line and the gates of the corresponding first to M-th memory transistors, respectively;
a first to an M-th sub-voltage control lines commonly provided to the memory blocks, and coupled to the gates of the first to M-th P-type transistors of each of the memory blocks, respectively;
an (M+1)th to a (2×M)th sub-voltage control lines commonly provided to the memory blocks, and coupled to the gates of the first to M-th N-type transistors of each of the memory blocks, respectively; and
a voltage control circuit rewriting data of a selected memory transistor of the memory transistors belonging to the selected memory block by independently controlling the respective voltages of the first voltage control line, the second voltage control line, and the first to (2×M)th sub-voltage control lines, applying a voltage, which is a voltage between a voltage of the first voltage control line and a voltage of the second voltage control line, to the gate of one of the P-type transistor and the N-type transistor corresponding to each of the memory transistors, and applying a voltage of the first or second voltage control line corresponding to a selected memory block of the memory blocks to a gate of the other transistor, wherein:
the voltage control circuit, in rewriting data of the selected memory transistor,
applies a reference voltage to a first voltage control line corresponding to the selected memory block and also applies a negative voltage to a second voltage control line corresponding to the selected memory block;
applies the reference voltage to a first voltage control line corresponding to a non-selected memory block other than the selected memory block and also applies a control voltage, which is a voltage between the reference voltage and the negative voltage, to a second voltage control line corresponding to the non-selected memory block;
applies the reference voltage to the sub-voltage control line corresponding to the selected memory transistor of the first to M-th sub-voltage control lines to turn off the P-type transistor corresponding to the selected memory transistor of the first to M-th P-type transistors, and applies the control voltage to the sub-voltage control line corresponding to the selected memory transistor of the (M+1)th to (2×M)th sub-voltage control lines to turn on the N-type transistor corresponding to the selected memory transistor of the first to M-th N-type transistors; and applies the control voltage to the sub voltage control line corresponding to the non-selected memory transistor among the first to M-th sub-voltage control lines to turn on the P-type transistor corresponding to the non-selected memory transistor of the first to M-th P-type transistors, and applies the negative voltage to the sub-voltage control line corresponding to the non-selected memory transistor of the (M+1)th to (2×M)th sub-voltage control lines to turn off the N-type transistor corresponding to the non-selected memory transistor of the first to M-th N-type transistors.

5. A semiconductor device comprising a plurality of memory blocks each including a first to an M-th (where, M is an integer of 2 or greater) memory transistors,
each of the first to M-th memory transistors storing data by a change in a level of a threshold voltage, and
the semiconductor device further comprising:
a first and a second voltage control lines provided corresponding to each of the memory blocks;
a first to an M-th P-type transistors provided corresponding to the first to M-th memory transistors of each of the memory blocks, and coupled between the corresponding first voltage control line and the gates of the corresponding first to M-th memory transistors, respectively;
a first to an M-th N-type transistors provided corresponding to the first to M-th memory transistors of each of the memory blocks, and coupled between the second voltage control line and the gates of the corresponding first to M-th memory transistors, respectively;
a first to an M-th sub-voltage control lines commonly provided to the memory blocks, and coupled to the gates of the first to M-th P-type transistors of each of the memory blocks, respectively;
an (M+1)th to a (2×M)th sub-voltage control lines commonly provided to the memory blocks, and coupled to the gates of the first to M-th N-type transistors of each of the memory blocks, respectively; and
a voltage control circuit rewriting data of a selected memory transistor of the memory transistors belonging to the selected memory block by independently controlling the respective voltages of the first voltage control line, the second voltage control line, and the first to (2×M)th sub-voltage control lines, applying a voltage, which is a voltage between a voltage of the first voltage control line and a voltage of the second voltage control line, to the gate of one of the P-type transistor and the N-type transistor corresponding to each of the memory transistors, and applying a voltage of the first or second voltage control line corresponding to a selected memory block of the memory blocks to a gate of the other transistor, wherein
the voltage control circuit includes:
a first drive circuit that is provided corresponding to the first voltage control line of each of the memory blocks, and includes a first power supply node, a second power supply node, a first control node, a first P-type sub-transistor, and a first N-type sub-transistor;
a second drive circuit that is provided corresponding to the second voltage control line of each of the memory blocks, and includes a third power supply node, a fourth power supply node, a second control node, a second P-type sub-transistor, and a second N-type sub-transistor;
a third drive circuit that is provided corresponding to each of the first to M-th sub-voltage control lines, and includes a fifth power supply node, a sixth power supply node, a third control node, a third P-type sub-transistor, and a third N-type sub-transistor; and a fourth drive circuit that is provided corresponding to each of the (M+1)th to (2×M)th sub-voltage control lines, and includes a seventh power supply node, an eighth power supply node, a fourth control node, a fourth P-type sub-transistor, and a fourth N-type sub-transistor, wherein:

the first P-type sub-transistor is coupled between the first power supply node and the corresponding first voltage control line;

the first N-type sub-transistor is coupled between the corresponding first voltage control line and the second power supply node;

both the gates of the first P-type sub-transistor and the first N-type sub-transistor are coupled to the first control node, the second P-type sub-transistor is connected between the third power supply node and the corresponding second voltage control line;

the second N-type sub-transistor is coupled between the corresponding second voltage control line and the fourth power supply node;

both the gates of the second P-type sub-transistor and the second N-type sub-transistor are coupled to the second control node;

the third P-type sub-transistor is coupled between the fifth power supply node and the corresponding sub-voltage control line;

the third N-type sub-transistor is coupled between the corresponding sub-voltage control line and the sixth power supply node;

both the gates of the third P-type sub-transistor and the third N-type sub-transistor are coupled to the third control node;

the fourth P-type sub-transistor is coupled between the seventh power supply node and the corresponding sub-voltage control line;

the fourth N-type sub-transistor is coupled between the corresponding sub-voltage control line and the eighth power supply node; and both the gates of the fourth P-type sub-transistor and the fourth N-type sub-transistor are coupled to the fourth control node.

6. The semiconductor device according to claim 5, wherein the voltage control circuit, in rewriting data of the selected memory transistor, applies a positive voltage to the first power supply node of the first drive circuit corresponding to the selected memory block and also applies a control voltage, which is a voltage between the positive voltage and a reference voltage, to the second power supply node and the first control node to turn on the first P-type sub-transistor and to turn off the first N-type sub-transistor;

applies a power supply voltage to the third power supply node and the second control node of the second drive circuit corresponding to the selected memory block and also applies the reference voltage to the fourth power supply node to turn off the second P-type sub-transistor and to turn on the second N-type sub-transistor;

applies the positive voltage to the fifth power supply node and the third control node of the third drive circuit corresponding to the selected memory cell and also applies the control voltage to the sixth power supply node to turn off the third P-type sub-transistor and to turn on the third N-type sub-transistor; and applies the control voltage to the seventh power supply node and the fourth control node of the fourth drive circuit corresponding to the selected memory cell and also applies the reference voltage to the eighth power supply node to turn off the fourth P-type sub-transistor and to turn on the fourth N-type sub-transistor.

7. The semiconductor device according to claim 5, wherein the voltage control circuit, in rewriting data of the selected memory transistor, applies a power supply voltage to the first power supply node and the first control node of the first drive circuit corresponding to the selected memory block and also applies a reference voltage to the second power supply node to turn off the first P-type sub-transistor and to turn on the first N-type sub-transistor;

applies a control voltage, which is a voltage between the reference voltage and the negative voltage, to the third power supply node and the second control node of the second drive circuit corresponding to the selected memory block and also applies the negative voltage to the fourth power supply node to turn off the second P-type sub-transistor and to turn on the second N-type sub-transistor;

applies the reference voltage to the fifth power supply node of the third drive circuit corresponding to the selected memory cell and also applies the control voltage to the third control node and the sixth power supply node to turn on the third P-type sub-transistor and to turn off the third N-type sub-transistor; and applies the control voltage to the seventh power supply node of the fourth drive circuit corresponding to the selected memory cell and also applies the negative voltage to the fourth control node and the eighth power supply node to turn on the fourth P-type sub-transistor and to turn off the fourth N-type sub-transistor.

* * * * *